(12) United States Patent
Mongeau

(10) Patent No.: US 12,117,482 B2
(45) Date of Patent: Oct. 15, 2024

(54) VIRTUAL MACHINE TESTING OF ELECTRICAL MACHINES USING PHYSICAL DOMAIN PERFORMANCE SIGNATURES

(71) Applicant: Vestas Wind Systems A/S, Aarhus (DK)

(72) Inventor: Peter Mongeau, Center Conway, NH (US)

(73) Assignee: Vestas Wind Systems A/S, Aarhus N. (DK)

( * ) Notice: Subject to any disclaimer, the term of this patent is extended or adjusted under 35 U.S.C. 154(b) by 18 days.

(21) Appl. No.: 17/921,136

(22) PCT Filed: Apr. 28, 2021

(86) PCT No.: PCT/DK2021/050132
§ 371 (c)(1),
(2) Date: Oct. 25, 2022

(87) PCT Pub. No.: WO2021/164838
PCT Pub. Date: Aug. 26, 2021

(65) Prior Publication Data
US 2023/0176125 A1    Jun. 8, 2023

Related U.S. Application Data

(60) Provisional application No. 63/020,676, filed on May 6, 2020.

(30) Foreign Application Priority Data

May 20, 2020    (DK) ............................ PA 2020 70331

(51) Int. Cl.
*G01R 31/28*    (2006.01)
*G01R 31/319*    (2006.01)

(52) U.S. Cl.
CPC ... *G01R 31/2872* (2013.01); *G01R 31/31917* (2013.01)

(58) Field of Classification Search
CPC ...................... G01R 31/2872; G01R 31/31917
See application file for complete search history.

(56) References Cited

U.S. PATENT DOCUMENTS

| 4,922,172 | A | 5/1990 | Roddy |
| 5,907,244 | A | 5/1999 | Crabill |

(Continued)

FOREIGN PATENT DOCUMENTS

| EP | 2476901 A1 | 7/2012 |
| EP | 3181900 A1 | 6/2017 |

(Continued)

OTHER PUBLICATIONS

Danish Patent and Trademark Office ,Search and Examination Report in PA 2020 70331, Oct. 21, 2020.

(Continued)

*Primary Examiner* — Joseph D Torres
(74) *Attorney, Agent, or Firm* — Wood Herron & Evans LLP

(57) ABSTRACT

Systems, methods, and computer program products for virtual machine testing of an electric machine. A test signature including parameter values measured during one or more static tests of the electric machine is compared to a reference signature generated by performing a similar series of static tests on a reference machine. The reference machine is then validated by subjecting the reference machine to full-load dynamic testing. The test and reference signatures may include a plurality of parameters each characterizing a physical property of the respective machines in one or more physical domains. The parameters are selected so that the electric machine can be qualified for operation in the field by (Continued)

comparing the test signature to the reference signature, thereby avoiding the need for full-load dynamic testing of the electric machine.

24 Claims, 14 Drawing Sheets

(56) References Cited

U.S. PATENT DOCUMENTS

| | | | |
|---|---|---|---|
| 7,649,378 B1 | 1/2010 | Cawthorne | |
| 9,423,448 B1* | 8/2016 | Naiknaware | H02S 40/32 |
| 2001/0007972 A1* | 7/2001 | Araki | G01R 31/31835 |
| | | | 703/16 |
| 2011/0231719 A1* | 9/2011 | Kim | G01R 31/318544 |
| | | | 714/E11.155 |
| 2014/0122011 A1 | 5/2014 | Cao | |
| 2019/0227003 A1* | 7/2019 | Ghasr | G07D 7/1205 |
| 2019/0278642 A1 | 9/2019 | Correia | |
| 2020/0043574 A1* | 2/2020 | Mehrotra | G06Q 30/04 |

FOREIGN PATENT DOCUMENTS

| | | |
|---|---|---|
| WO | 2015143233 A2 | 9/2015 |
| WO | 2019120404 A1 | 6/2019 |

OTHER PUBLICATIONS

European Patent Office, International Search Report and Written Opinion in PCT Application No. PCT/DK2021/050132, Jul. 23, 2021.

\* cited by examiner

VIRTUAL MACHINE TESTING OF ELECTRICAL MACHINES USING PHYSICAL DOMAIN PERFORMANCE SIGNATURES

BACKGROUND

This invention generally relates to testing of electric machines, and in particular to methods, systems, and computer program products for factory acceptance testing of large electric machines used for power generation in wind turbines.

Wind turbines are a growing source of electricity due in part to their low carbon footprint and concerns over the impact of traditional methods of generating electricity on the environment. However, in order to accelerate the replacement of plants that rely on fossil fuels with wind turbines, and to remain competitive with other forms of renewable energy, it is important to continue to reduce the cost of providing electricity with wind turbines. One source of costs with wind turbines is associated with factory acceptance testing of generators.

Due to the cost of transporting and installing a generator in wind power applications, wind power system operators typically require that each generator be subjected to full-load testing prior to reception. The reliability of wind-turbine components such as the generator are of particular concern to off-shore wind power systems due to the increased cost and time involved in servicing these wind turbines as compared to land-based systems.

Conventional full-load testing of a generator involves mechanically coupling the rotor of the generator under test to another electric machine that is operated as a motor. The motor converts electrical energy into rotational energy that is provided to the generator, and the generator converts the rotational energy back into electrical energy. The electricity generated by the generator under test is supplemented with additional power from the electrical grid to make up for power losses in the motor and generator, and fed back into the motor.

Because full-load testing requires mechanical and electrical systems that replicate full operating conditions, the cost of full-load testing can be expensive. Expenses include the capital expense of test equipment, the time required for testing, and the labor resources necessary to conduct the tests. As the size of a generator increases, the electrical and mechanical forces involved in full-load testing of the generator also increase. This drives up the size and cost of test equipment, as well as the time it takes to set up a test. Thus, testing expenses scale in relationship to the size and power rating of the electric machine being tested. Furthermore, these testing expenses may need to be replicated at all manufacturing sites, further increasing the overall product cost.

To accommodate increases in the demand for wind energy, manufacturers have been developing wind turbines having larger capacities, which require correspondingly larger generators. Moreover, many of these large-capacity wind turbines are being deployed off-shore to take advantage of favorable wind conditions found there, and to reduce the impact of the wind turbines on persons living in coastal areas. Hence, both the need to perform testing on generators for wind power systems and the cost of this testing has been trending upward.

Thus, there is a need for improved systems, methods, and computer program products for testing production machines that provide a high level of confidence the production machine will operate properly without the time and expense of full scale dynamic testing.

SUMMARY OF INVENTION

In an embodiment of the invention, an apparatus for testing an electric machine is provided. The apparatus includes one or more processors, and a memory coupled to the one or more processors. The memory includes program code that, when executed by the one or more processors, causes the apparatus to measure a first value of a first parameter indicative of a response of at least one device under test to a static test, and generate a test signature based at least in part on the first value of the first parameter. The apparatus compares the test signature to a reference signature. If the test signature matches the reference signature, the apparatus passes the at least one device under test. If the test signature does not match the reference signature, the apparatus fails the at least one device under test.

In an aspect of the invention, the program code may further cause the apparatus to stimulate the at least one device under test with at least one stimulus, and the response of the at least one device under test may be a reaction to the stimulus.

In another aspect of the invention, the at least one stimulus may simulate an operating condition of the device under test.

In another aspect of the invention, the reference signature may be generated by measuring a second value of the first parameter indicative of the response of a reference device to the static test, and generating the reference signature based at least in part on the second value of the first parameter.

In another aspect of the invention, the second value of the first parameter used to generate the reference signature may be measured before the reference device is subjected to qualification testing, a third value of the first parameter used to generate the reference signature may be measured after the reference device is subjected to qualification testing, a post-performance test signature may be generated from the third value of the first parameter, and one or more of a reliability projection, a wear projection, or an aging projection for the reference device may be determined by comparing the post-performance test signature to the reference signature.

In another aspect of the invention, the test signature includes at least a portion of a test map of the at least one device under test, the reference signature includes at least a portion of a reference map of the reference device, and the first parameter of the at least one device under test is determined from the at least the portion of the test map.

In another aspect of the invention each test map and each reference map is divided into cells, and the first parameter of each cell of the test map is compared to the first parameter of a corresponding cell of the reference map.

In another aspect of the invention, the first parameter defines a first physical property of a first physical domain, wherein the first physical domain is one of a magnetic domain, an electrical domain, a thermal domain, and a mechanical domain.

In another aspect of the invention, the first parameter may define a first physical property of a first physical domain, and each of the test signature and the reference signature may include a second parameter that defines a second physical property of a second physical domain different from the first physical domain.

In another aspect of the invention, the first physical domain may be one of a magnetic domain, an electrical domain, a thermal domain, and a mechanical domain, and the second physical domain may be another of the magnetic domain, the electrical domain, the thermal domain, and the mechanical domain.

In another aspect of the invention, the at least one device under test may include a stator of a test machine, the at least one stimulus may include an electric signal applied to a winding of the stator, and the first parameter may include a temperature of the stator.

In another aspect of the invention, the test signature may include at least a portion of a test thermal map of the at least one device under test, the reference signature may include at least a portion of a reference thermal map of the reference device, and the temperature of the at least one device under test may be determined from the at least the portion of the test thermal map.

In another aspect of the invention, each thermal map may be divided into cells, and the temperature of each cell of the test thermal map may be compared to the temperature of a corresponding cell of the reference thermal map.

In another aspect of the invention, the test machine may include one or more thermal sensors, and the test thermal map may be used to calibrate the one or more thermal sensors.

In another aspect of the invention, the at least one stimulus may include a mechanical forcing function applied to an input point of the at least one device under test, and the first parameter may be a vibration of the at least one device under test.

In another aspect of the invention, the test signature may include at least a portion of a test vibration map of the at least one device under test, the reference signature may include the at least a portion of a reference vibration map of the reference device, and the vibration of the at least one device under test may be determined from the at least the portion of the test vibration map.

In another aspect of the invention, each vibration map may be divided into cells, and the vibration of each cell of the test vibration map may be compared to a corresponding cell of the reference vibration map.

In another aspect of the invention, the at least one stimulus may include a stimulation pattern having a plurality of mechanical forcing functions, and each of the forcing functions may have an independent amplitude, an independent phase, an independent orientation, and an independent input point.

In another aspect of the invention, the at least one reference device may include a component of a reference machine which has passed full qualification testing.

In another aspect of the invention, the test signature and the reference signature may each include a second parameter that defines a second physical property of a second physical domain different from the first physical domain.

In another aspect of the invention, said electric machine is a generator for a wind turbine, and wherein said testing of said electric machine is performed prior to installation of said generator in said wind turbine.

In another embodiment of the invention, a method for manufacturing a wind turbine is provided. The method includes measuring the first value of the first parameter indicative of the response of the at least one device under test to the static test, generating the test signature based at least in part on the first value of the first parameter, and comparing the test signature to the reference signature. If the test signature matches the reference signature, the at least one device under test is installed in the wind turbine. If the test signature does not match the reference signature, the at least one device is not installed in the wind turbine.

In another aspect of the invention, the test signature includes at least a portion of a test map of the at least one device under test, the reference signature includes at least a portion of a reference map of the reference device, and the first parameter of the at least one device under test is determined from the at least the portion of the test map.

In another aspect of the invention each test map and each reference map is divided into cells, and the first parameter of each cell of the test map is compared to the first parameter of a corresponding cell of the reference map.

In another aspect of the invention, the first parameter defines a first physical property of a first physical domain, wherein the first physical domain is one of a magnetic domain, an electrical domain, a thermal domain, and a mechanical domain.

In another embodiment of the invention, a method for testing electric machines is provided. The method includes measuring the first value of the first parameter indicative of the response of the at least one device under test to the static test, generating the test signature based at least in part on the first value of the first parameter, and comparing the test signature to the reference signature. If the test signature matches the reference signature, the method passes the at least one device under test. If the test signature does not match the reference signature, the method fails the at least one device under test.

In another embodiment of the invention, a computer program product is provided. The computer program product includes a non-transitory computer-readable storage medium and program code stored on the non-transitory computer-readable storage medium. The program code is configured so that, when it is executed by one or more processors, the program code causes the one or more processors to measure the first value of the first parameter indicative of the response of the at least one device under test to the static test, generate the test signature based at least in part on the first value of the first parameter, and compare the test signature to the reference signature. If the test signature matches the reference signature, the program code causes the one or more processors to pass the at least one device under test. If the test signature does not match the reference signature, the program code causes the one or more processors to fail the at least one device under test.

The above summary presents a simplified overview of some embodiments of the invention to provide a basic understanding of certain aspects of the invention discussed herein. The summary is not intended to provide an extensive overview of the invention, nor is it intended to identify any key or critical elements, or delineate the scope of the invention. The sole purpose of the summary is merely to present some concepts in a simplified form as an introduction to the detailed description presented below.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

Figure 1:
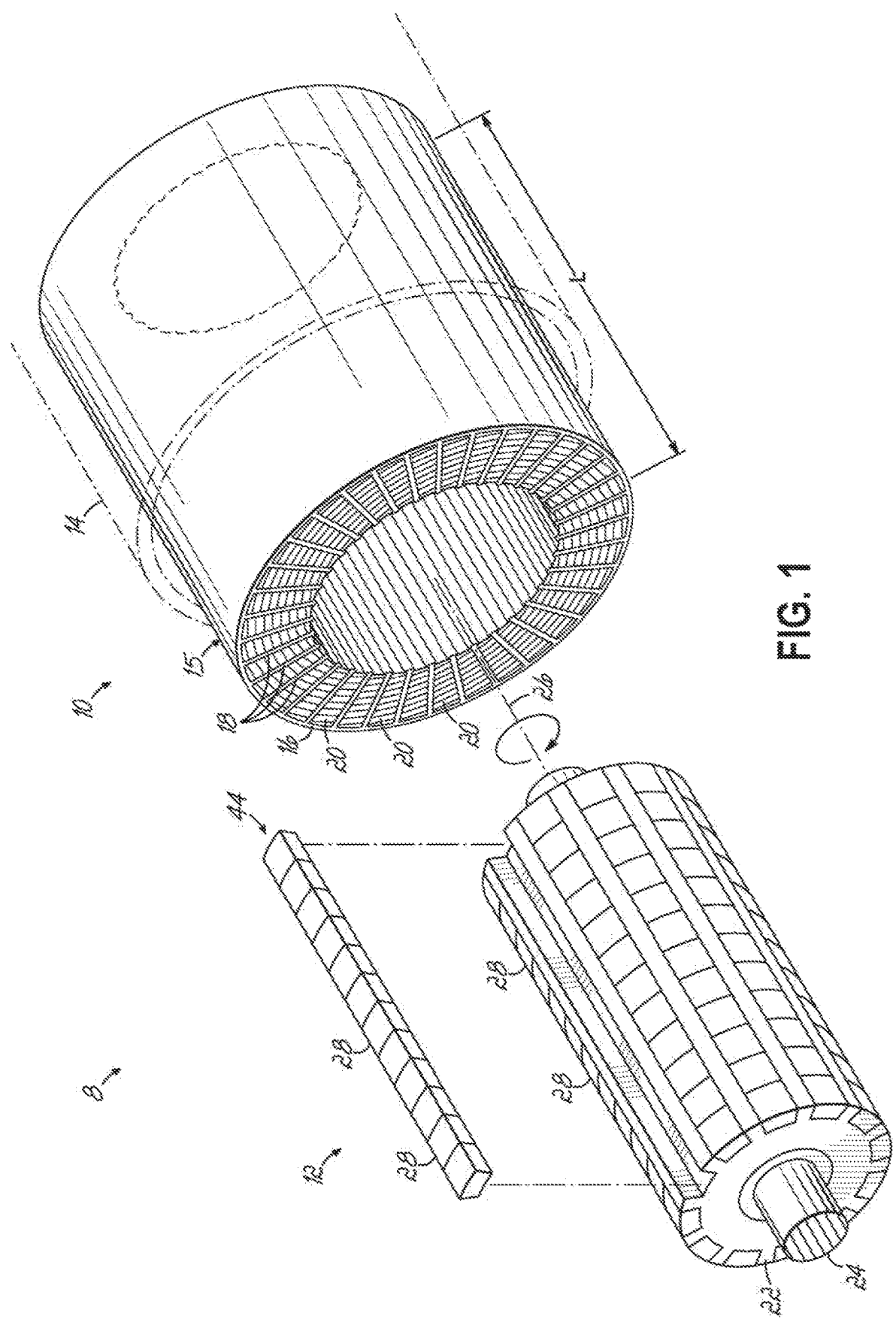
FIG. 1 is an exploded perspective view of rotor and stator assemblies of an electric machine, in accordance with an embodiment of the invention.

It should be understood that the appended drawings are not necessarily to scale, and may present a somewhat simplified representation of various features illustrative of the basic principles of the invention. The specific design features of the sequence of operations as disclosed herein, including, for example, specific dimensions, orientations, locations, and shapes of various illustrated components, may be determined in part by the particular intended application and use environment. Certain features of the illustrated embodiments may have been enlarged or distorted relative to others to facilitate visualization and a clear understanding. In particular, thin features may be thickened, for example, for clarity or illustration.

DETAILED DESCRIPTION OF THE INVENTION

Embodiments of the invention are directed to systems, methods, and computer program products for virtual machine testing of an electric machine. Virtual machine testing is an approach in which one or more key parameters are defined in one or more physical domains of the electric machine. These key parameters are used to provide a signature that is indicative of the performance of the electric machine under operating conditions. A test signature generated from parameter values measured during one or more static tests of an electric machine (i.e., test machine) may be compared to a reference signature generated from performing a similar series of static tests on a reference machine. The reference machine may be an electric machine that has undergone full-load dynamic testing to ensure the reference machine meets all testing standards. Comparing the test signature to the reference signature may provide a reliable indication of whether the test machine will perform as well as the reference machine under similar operating conditions. This may allow for production machines to be tested in a robust fashion without requiring either full-load or partial-load testing.

Virtual machine testing may include reproducing one or more stimuli in a particular domain characteristic of the operating environment of the test machine. These stimuli may be reproduced, for example, by feeding energy into a device under test, e.g., the test machine or a component thereof. The reaction of the device under test to each stimulus may be compared to one or more reactions obtained from a reference device (e.g., the reference machine or a component thereof) subjected to the same or an equivalent stimulus. Virtual machine testing of the reference device may establish the reference signature for a particular type of electric machine tested at a particular power level. This reference signature may then be used as a basis of comparison for subsequent testing of similar electric machines.

Physical domain testing that may be used to generate reference signatures may include, but is not limited to, magnetic domain testing, electrical domain testing, thermal domain testing, and mechanical domain testing. Virtual machine testing may include one or more static tests that generate data in one or more of the above domains. The data generated by these tests may be indicative of the value of each parameter of the test signature. Each of these test parameter values can be compared to respective reference parameter values obtained from the reference machine when it was subjected to the same tests. Certain parameters may have multiple dimensions. Depending on the type and resolution of the virtual machine test data obtained, virtual machine testing may provide a higher degree of qualification than conventional electric machine testing, which is often limited by the number of sensors that can be employed.

Figure 2:
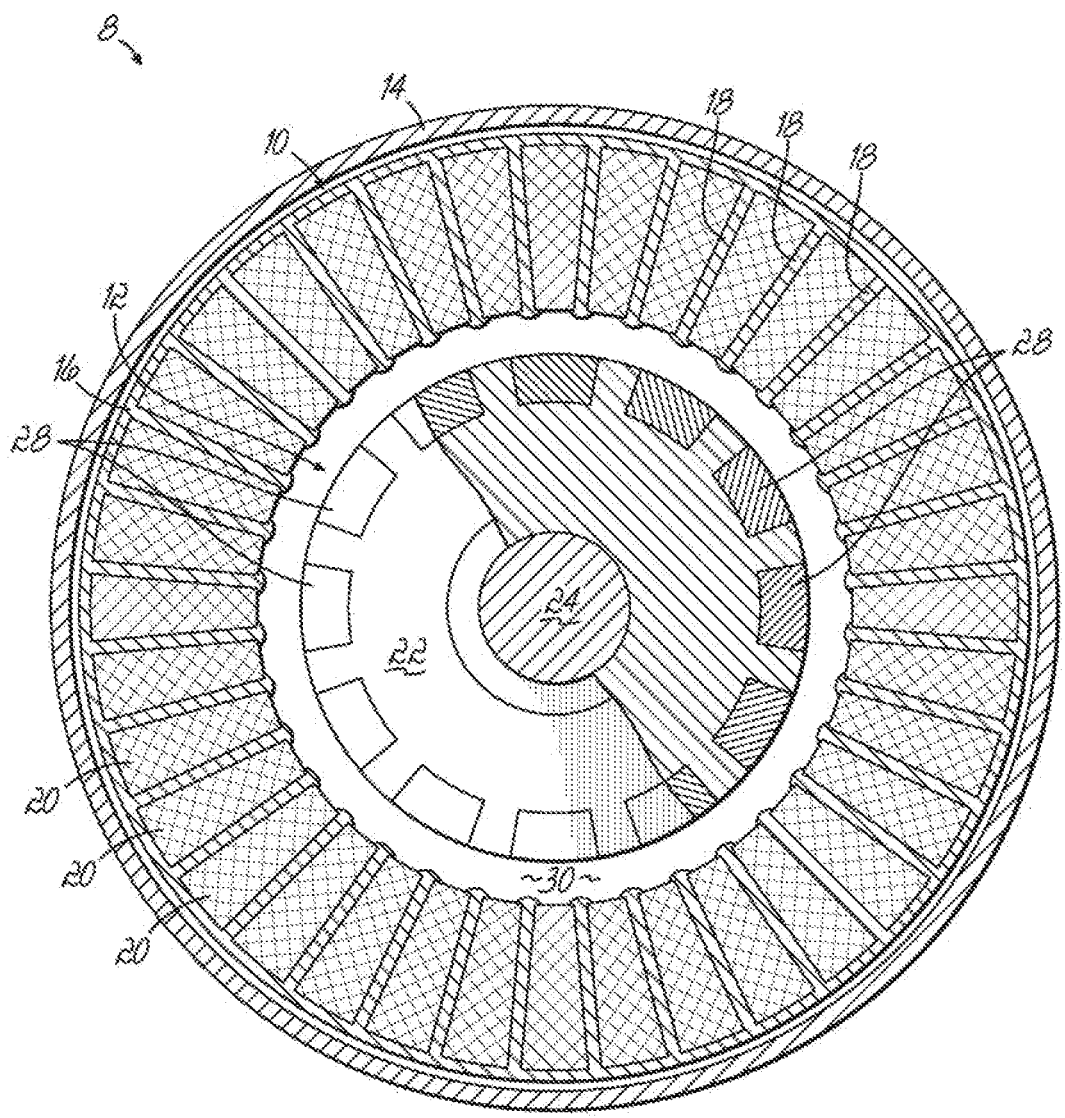
FIG. 2 is a cross-sectional view showing the electric machine of FIG. 1.

FIGS. 1 and 2 depict an exemplary electric machine 8 comprising a stator 10, a rotor 12, and a housing 14, and having a radial flux topology in accordance with an embodiment of the invention. The stator 10 and a rotor 12 have a concentric arrangement. The stator 10 is fixed and stationary, and the rotor 12 is configured to rotate relative to the stator 10. As it rotates, the rotor 12 produces a rotating magnetic field that interacts with the stator 10. Although the exemplary electric machine 8 has only one stator 10 and one rotor 12 with a concentric arrangement, embodiments of the invention are not so limited. It should be understood that embodiments of the invention may be used with electric machines having one or more rotors or one or more stators. These electric machines may also include a stator disposed radially inside a rotor, or include stators and rotors having an axial flux topology.

The stator 10 may include a stator frame 15 with an annular outer yoke 16, a plurality of teeth 18 projecting radially inward from the outer yoke 16 toward the rotor 12, and a plurality of coils 20 disposed within slots between adjacent teeth 18. The teeth 18 and slots defined thereby may extend along a full length L of the stator frame 15. The stator 10 remains stationary during the operation of the electric machine 8, and represents the non-rotating part of the electric machine 8. The teeth 18 and outer yoke 16 may be composed of a ferromagnetic material. Each coil 20 may include loops or turns of a conductive material that are electrically insulated from each other. Each coil 20 may also be connected in series with one or more other coils 20 to collectively form windings of the stator 10.

The rotor 12 may include a rotor core 22, a plurality of magnetic poles 28 circumferentially distributed about the rotor core 22, and a drive shaft 24 that operatively couples the rotor core 22 to an external load (when operated as a motor) or an external source of rotational energy (when operated as a generator). The drive shaft 24 is configured to enable rotation of the rotor 12 about a longitudinal axis 26 thereof. The rotor 12 may be generally cylindrical in shape and include a plurality of magnetic poles 28 such that an air gap 30 is defined between the magnetic poles 28 and the distal ends of the teeth 18 of stator 10. When the electric machine 8 is operating, the rotor 12 rotates or spins about the longitudinal axis 26 relative to the stationary stator 10.

When operated as a generator, the stator 10 and rotor 12 of electric machine 8 operate cooperatively to convert rotational energy received through the drive shaft 24 into electrical energy. The electric machine 8 may thereby harness kinetic energy provided by a prime mover for power generation. Specifically, the motion of the magnetic poles 28 of the rotor 12 past the stationary coils 20 of the stator 10 induces an electrical current in each of the coils 20 according to the precepts of Faraday's Law. These electrical currents may in turn be coupled to an external load to which power is provided.

Although the electric machine 8 has a rotor 12 with magnetic poles 28 that are depicted as permanent magnets, embodiments of the invention are not so limited. For example, electric machines 8 having rotors 12 with magnetic poles 28 that are provided by electro-magnets may also be used. In addition, the electric machines 8 may also be configured with magnetic poles 28 in the stator 10 and coils 20 in the rotor 12.

Figure 3:
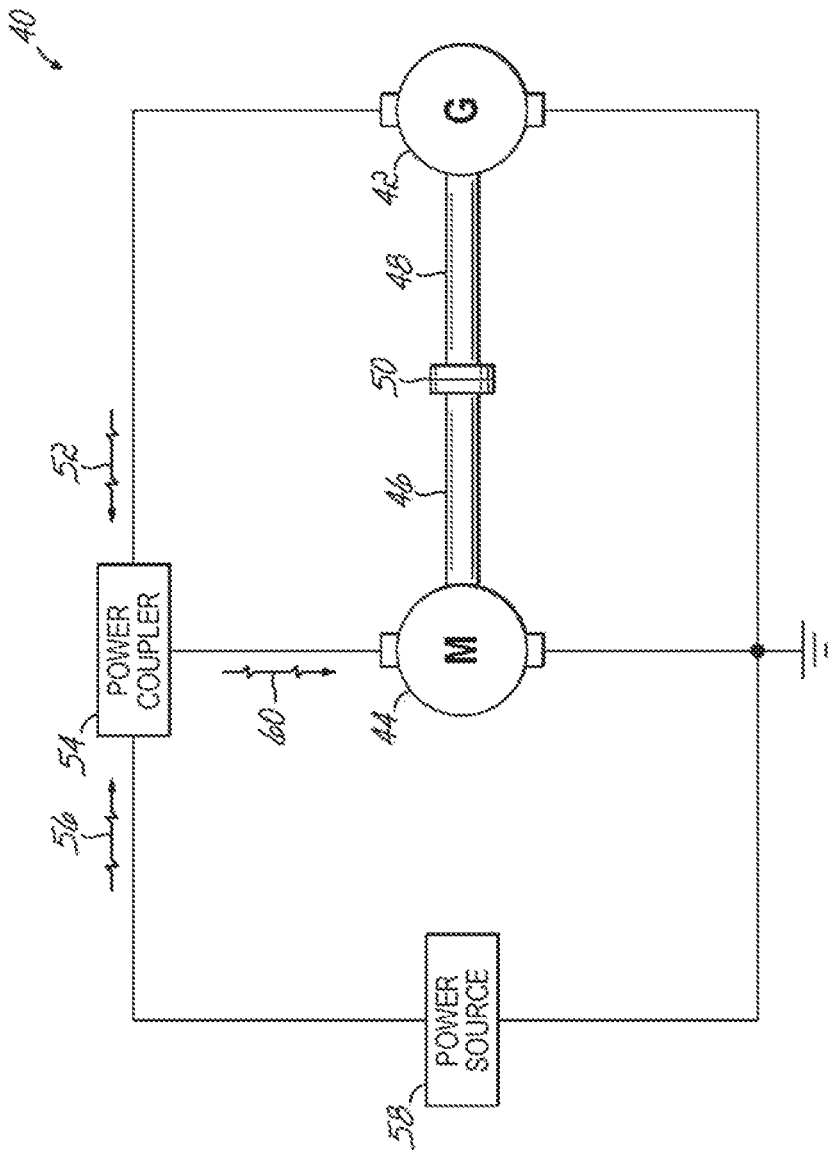
FIG. 3 is a diagrammatic view of a test setup for performing full-load testing on an electric machine such as depicted in FIGS. 1 and 2.

FIG. 3 illustrates an exemplary test setup 40 for qualifying a reference machine 42 using full or partial-load testing. The test setup 40 includes a motor 44 comprising an electric machine having a rotary shaft 46 that is operatively coupled to a rotary shaft 48 of the reference machine 42 by a coupling 50. The reference machine 42 and motor 44 may be duplicate electric machines, and are typically operated in a generating mode and in a motoring mode, respectively. The reference machine 42 may be, for example, a protype electric machine used to validate a new design, or may be a production machine selected off an assembly line to serve as a reference machine for virtual machine testing of other production machines.

The coupling 50 may be configured to allow adjustment of the rotational angle of the shafts 46, 48 to set a displacement angle between the reference machine 42 and motor 44. Because the shaft power of a synchronous machine depends on the displacement angle of the shaft, the load on the reference machine 42 may be adjusted by varying the angle of the coupling between the reference machine 42 and motor 44. Current 52 output by the reference machine 42 may be fed back into the motor 44 through a power coupler 54. Additional current 56 from a power source 58 (e.g., the electric grid) may be combined with the current 52 generated by the reference machine 42, and the combined current 60 fed into the motor 44. The current drawn from the power source 58 may be sufficient to compensate for internal losses in the reference machine 42 and motor 44.

The test setup 40 provides mechanical and electronic systems that may be used to replicate full operating conditions, as required for full-load testing. However, full-load testing can be expensive due to the capital expense of the test equipment as well as the time and labor resources necessary to conduct each test. These expenses scale in direct relationship to the machine size and power rating, so as electric machines grow in capacity, performing full-load testing on these machines likewise becomes more expensive. Conventional factory acceptance testing typically requires each production machine to be operated over its full operating speed range at full torque and full power. This requires a capability to perform full-load testing on each production machine.

Virtual machine testing involves the use of the reference machine 42 to establish reference signatures that are used to qualify additional electric machines to a similar level of confidence, but without the need for repeated use of the full-load testing test setup 40. Advantageously, this may allow large production machines to be qualified for installation as generators without subjecting them to full-load testing.

Figure 4:
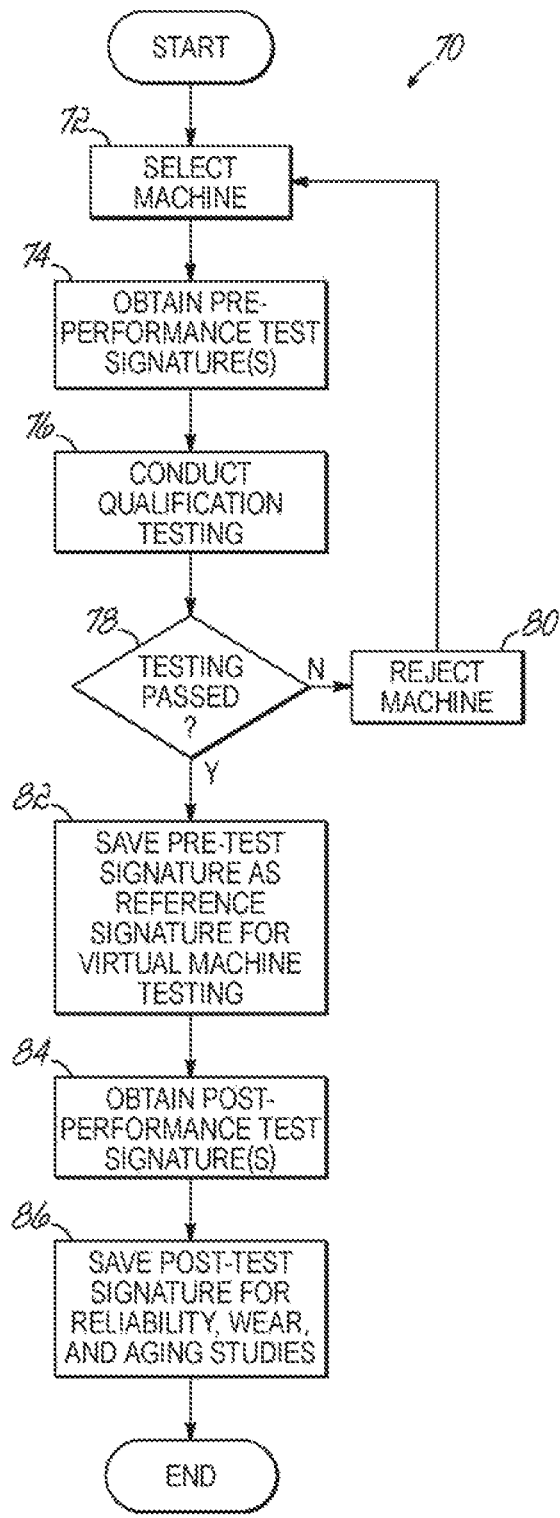
FIG. 4 is a flowchart of a process for performing qualification testing of a reference machine that may use the test setup of FIG. 3.

FIG. 4 depicts a flowchart illustrating an exemplary process 70 that may be used to generate one or more reference signatures for evaluating electric machines in accordance with an embodiment of the invention. In block 72, the process 70 selects an electric machine to be used as the reference machine 42. The electric machine may be a prototype for a production run of electric machines, or may be selected from a group of production machines that are to be accepted using virtual machine testing.

In response to selecting the electric machine, the process 70 may proceed to block 74 and obtain one or more pre-performance test signatures from the electric machine. Obtaining the test signatures may include subjecting the electric machine, or one or more components thereof, to one or more static tests. Exemplary static tests may include magnetic flux tests of the rotor, electrical tests of the stator windings, thermal testing of the stator, and vibration testing of the rotor. Exemplary systems and processes for performing static tests and obtaining parameter values used to generate test signatures are described in more detail below.

In block 76, the process 70 may perform full qualification testing on the selected electric machine. Full qualification testing may include full-load testing as described above with respect to FIG. 3, as well as any other testing required by the customer for qualification testing. If the electric machine does not pass full qualification testing ("NO" branch of decision block 78), the process may proceed to block 80, reject the machine, and return to block 72 to select another electric machine for qualification as a reference machine. The rejected electric machine may be sent back to the factory for repairs, or the rejected electric machine may be scrapped, and another electric machine selected for testing as the reference machine.

If the electric machine passes full qualification testing ("YES" branch of decision block 78), the process 70 may proceed to block 82. In block 82, the process 70 may save the pre-performance test signatures (e.g., in a test signature database) for use in performing virtual machine testing on other electric machines. The process 70 may then proceed to block 84 and obtain post-performance test signatures from the electric machine. Post-performance test signatures may be obtained from the electric machine in the same manner as the pre-performance test signatures.

In block 86, the process 70 may save the post-performance test signatures for use in reliability, wear, and aging studies. Comparing the post-performance test signature to its corresponding pre-performance test signature may provide information on how the electric machine responds to aging and use. This information may be used to identify which components are most likely to fail over time, and how operating conditions affect aging and wear of components. Because certain aspects of the qualification testing performed on the reference machine in block 76 may be expected to cause wear to the electric machine, post-performance test signatures for the reference machine are typically used only for characterizing the effects of testing on the reference machine. That is, post-performance test signatures are typically not suitable for use as a reference signature.

The reference signatures stored in the database may be used for virtual machine testing of additional electric machines. Test signatures obtained from production machines may be considered as matching the reference signature or signatures if the differences between the test and reference signatures are within the measurement tolerances of the parameters being measured. Test signatures may also be considered as matching if they are within any other threshold level that would result in no material differences between the performance of the devices producing the test signatures. These threshold levels may be determined on a parameter-by-parameter basis using empirical data obtained from testing electrical machines having test signatures with different parameter values, for example.

Rather than a full dynamic rotating machine test, virtual machine testing measures one or more parameters of a device under test (which may be an electric machine or a component thereof) in one or more physical domains. Exemplary parameters may include any physical property indicative of a characteristic of the device under test, e.g., current, voltage, impedance, magnetic flux, temperature, vibration, etc. The values of the parameters measured for the device under test may then be compared to those determined for the reference machine using the same static tests. Because the performance of an electric machine is generally deterministic, devices under test having parameter values that match those of the reference machine can be expected to perform similarly so long as the parameters measured are properly selected.

Figure 5:
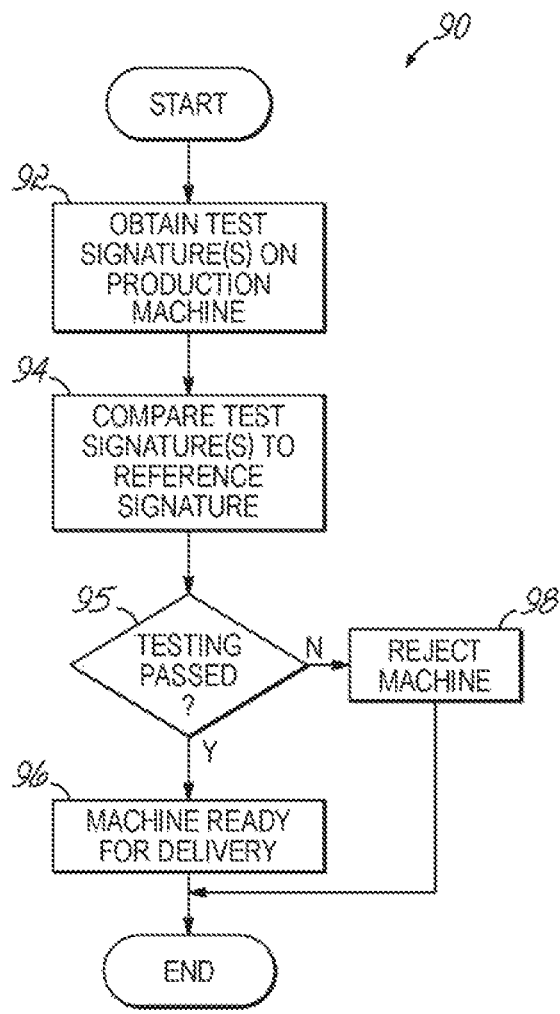
FIG. 5 is a flowchart of a process for performing virtual machine testing of a production machine using the reference signature generated by the process of FIG. 4.

FIG. 5 depicts a flowchart illustrating an exemplary process 90 that may be used for virtual machine testing of a production machine in accordance with an embodiment of the invention. In block 92, one or more test signatures may be obtained from the production machine. These test signatures may be obtained by performing one or more static tests, and generating a test signature based on the data collected during at least one of those tests. For example, a test signature may include a set of parameter values each corresponding to the results of a specific test. Static tests performed on the production machine may include tests that determine one or more magnetic parameters, electrical parameters, thermal parameters, or mechanical parameters of the production machine as a whole, or component of the production machine such as the stator 10 or rotor 12.

Once the test signatures have been obtained, the process 90 may proceed to block 94 and compare each of the one or more test signatures generated for the production machine with a corresponding reference signature. If the comparison satisfies pre-defined acceptance criteria, ("YES" branch of decision block 95), the process 90 may proceed to block 96, classify the production machine as having passed factory acceptance testing, and release the production machine for delivery, e.g., by changing the status of the machine in an inventory tracking database.

If the comparison does not satisfy the predefined acceptance criteria ("NO" branch of decision block 95), the process 90 may proceed to block 98 and reject the production machine. Depending on the outcome of the virtual testing, rejected production machines may be rebuilt or repaired, and then retested. In other cases, certain components may be recycled into other production machines, or the failing production machine may be scrapped.

Rather than relying on full scale dynamic machine testing of production machines to verity they meet factory acceptance standards, virtual machine testing extends or replaces machine testing at the assembly, sub-assembly, or component level. These building blocks of production machines may be exercised in a controlled fashion to excite the test element in a controlled set of one or more physical domains. Virtual machine testing may be performed at various levels of the product cycle, and for different reasons. For example, virtual machine testing may be performed at the factory level for factory acceptance testing as a way to avoid having to invest in full-load test facilities and confirm a high level of reproducibility with respect to a validated reference machine. At the design validation level, specialized test set ups may be used to perform enhanced Highly Accelerated Life Testing (HALT) or the like. This may facilitate the study of extreme load behavior, life cycle/reliability, etc., without the need for a dynamic full-power over capacity test stand. Virtual machine testing may also be used to accelerate cyclic loading mechanisms so that testing is completed in days or weeks rather than months. Virtual machine testing may also allow examination of failure modes that would be too costly or dangerous to allow during full power testing.

Magnetic Domain Testing

Magnetic domain testing may include tests that produce data indicative of one or more characteristics of magnetic fields produced by the electric machine, such as flux density and orientation. Magnetic fields within the electric machine may be measured using one or more magnetic sensors, such as a fluxgate sensor, Hall effect sensor, magnetoresistance sensor, induction coil, or any other suitable sensor. Magnetic sensors may, for example, output a voltage or current proportional to the density of the magnetic field passing through the probe. Magnetic sensors may be positioned to measure magnetic field densities in key areas, such as in the air gaps between the rotor and stator of the electric machine. These measurements may provide an indication of whether the electric machine is producing magnetic fields consistent with proper operation.

Checking the back electromotive force voltage $V_{B\_EMF}$ produced by the electric machine while the rotor is spinning can provide an indication of an overall condition of the magnetic components of the electric machine. For permanent magnet generators, comparing a magnetic flux map of a device under test to one obtained from the reference machine may provide information equivalent to (or even more detailed than) that provided by checking the back electromotive force voltage $V_B$ EMF, but without having to spin the rotor.

Figure 6:
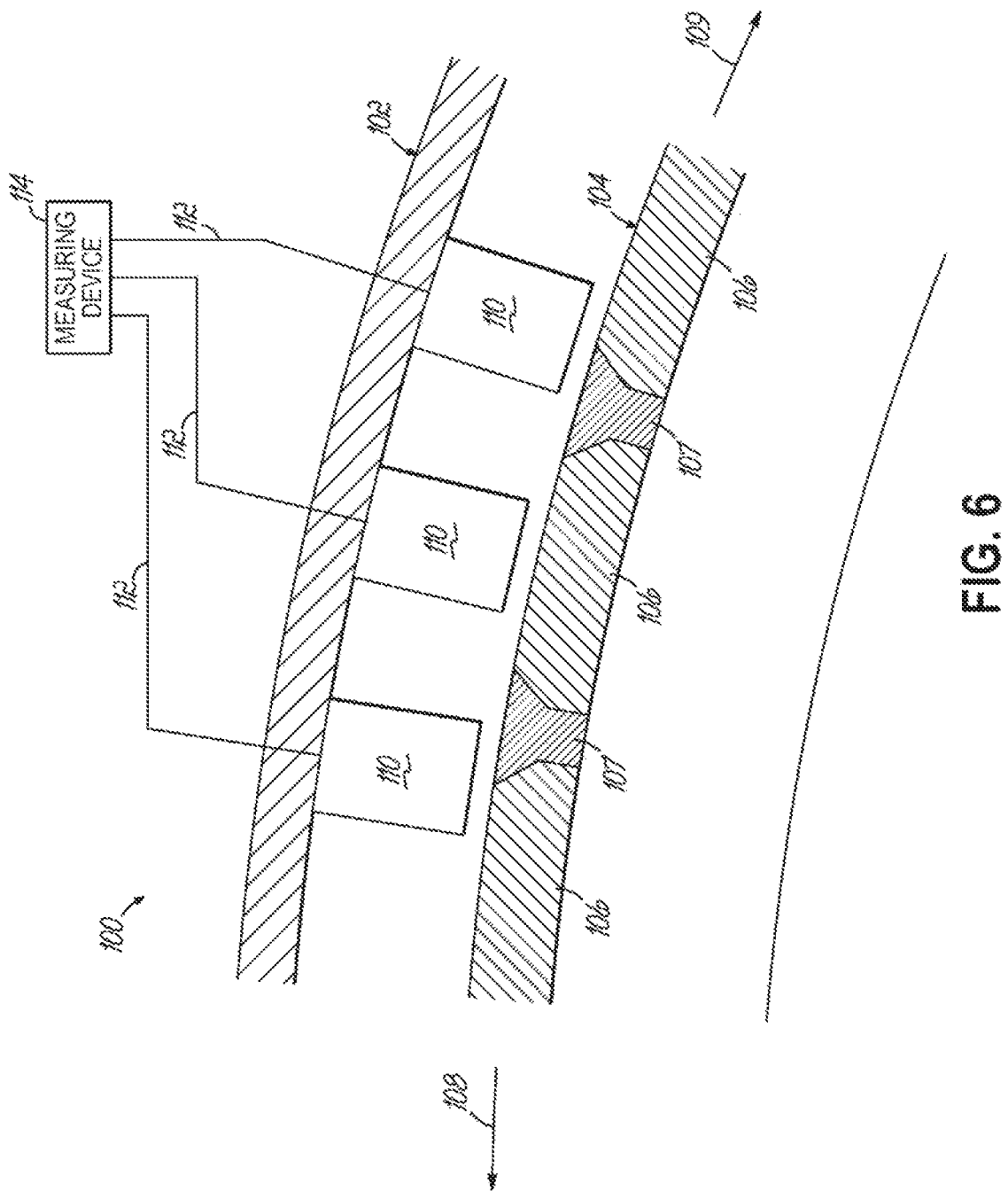
FIG. 6 is a diagrammatic view of a system which may be used to measure magnetic flux in the electric machine of FIGS. 1 and 2.

FIG. 6 depicts an exemplary system 100 for measuring magnetic flux in an electric machine including a stator 102 and a rotor 104. The rotor 104 includes a plurality of magnets 106 held in place by retainers 107, and moves relative to the stator 102 as indicated by arrows 108, 109. The system 100 further includes a plurality of magnetic sensors 110, which may be located in the stator 102. The magnetic sensors 110 are configured so that the magnets 106 pass by the magnetic sensors 110 as the rotor 104 rotates. Each time a magnet 106 passes a magnetic sensor 110, a signal 112 (e.g., a current or voltage) may be generated by the magnetic sensor 110. The signal 112 may have an amplitude proportional to the magnetic flux density at the sensor, the rate at which the magnetic flux density changes with respect to time, an orientation of the magnetic flux with respect to the sensor 110, or any combination of flux density, rate of change, and orientation.

The signals 112 generated by the magnetic sensors 110 may be provided to a measuring device 114 that records the signals. The signals 112 may be recorded, for example, by periodically sampling the signal. These samples may comprise data indicative of the amplitude of the signal 112 when the sample was taken. Samples may be stored in memory as magnetic flux data indexed to the magnetic sensor 110 providing the signal, the time the sample was taken, the position of the rotor 104 at the time the sample was taken, or any combination thereof. The rotational position of the rotor 104 may allow magnetic flux data received from the magnetic sensors 110 to be associated with a specific magnet 106 of rotor 104.

The stored magnetic flux data may be used to generate a magnetic flux map indicative of the magnetic flux density with respect to position on the rotor 104. The magnetic flux map may provide a pictorial depiction of magnetic field densities in and around the rotor 104. The magnetic flux map may thereby facilitate verification of adequate magnetization of magnets 106 or identification of portions of the rotor 104 that need attention. Magnetic flux maps obtained for production generators may be compared to a reference magnetic flux map obtained from the reference machine. Differences between the magnetic flux maps may be quantified using image analysis techniques. If the differences exceed a threshold, the device under test may be failed.

The magnetic sensors 110 may be permanently embedded in the stator 102 (e.g., during manufacturing), temporary mounted to or embedded in the stator 102 (e.g., by replacing one or more sections of the stator coils for testing of the rotor 104), or may comprise portions of the windings of the stator 102. For embodiments in which the magnets 106 are magnetized in-situ, the magnetic sensors 110 may be integrated into the magnetization system. The same system that magnetizes the rotor 104 can then be used to generate a multi-dimensional (e.g., two-dimensional) magnetic flux map of the rotor 104. This may allow magnetic flux data to be analyzed immediately after magnetization of the rotor 104, and corrective action taken if any magnetic anomalies are detected. Acceptance criteria may be developed by comparing the magnetic flux map of the device under test to one or more magnetic flux maps generated for one or more reference machines. In cases where the magnetic flux maps match, back electromotive force voltage $V_{B\_EMF}$ testing may be superfluous and thus omitted.

Electrical Domain Testing

Electrical domain testing may include tests that produce data indicative of one or more characteristics of the windings of the stator. Winding characteristics may include winding configuration (i.e., how the conductors are wound on the stator), the integrity of the conductor (e.g., the presence or absence of open circuits), the integrity of the insulation coating the conductor (e.g., the presences or absence of short circuits), and proper electrical connectivity. This data may be obtained by monitoring the reaction of the stator to a stimulus provided by applying electrical signals having specific characteristics (e.g., amplitude and waveshape) to the windings.

Static electrical domain testing may include insulation integrity tests (e.g., insulation resistance, high potential stressing, surge testing), partial discharge testing, and measuring impedance parameters (e.g., resistance, inductance, capacitance) of the winding using direct current and time varying signals having different frequency components. All parameter values obtained from these tests may be tracked in production and compared to corresponding parameter values obtained from the reference machine.

Thermal Domain Testing

Typically, the dominant losses and critical temperatures in electric machines are due to ohmic losses in the windings. Other sources of power loss may include losses due to eddy currents and hysteresis in the stator core, vibrations, and skin depth effects in the windings. Static thermal domain testing may include stimulating the device under test (e.g., the stator) with high power alternating currents while capturing thermal images of the device under test to develop a thermal map thereof. Thermal images may be captured over a period of time in order to document both transient and steady state thermal characteristics of the device under test. Using these thermal images, thermal maps may be generated for the device under test for various stimulation conditions. Thermal maps from production machines may then be compared to a thermal map obtained from a reference machine as part of a virtual machine testing protocol.

Figure 7:
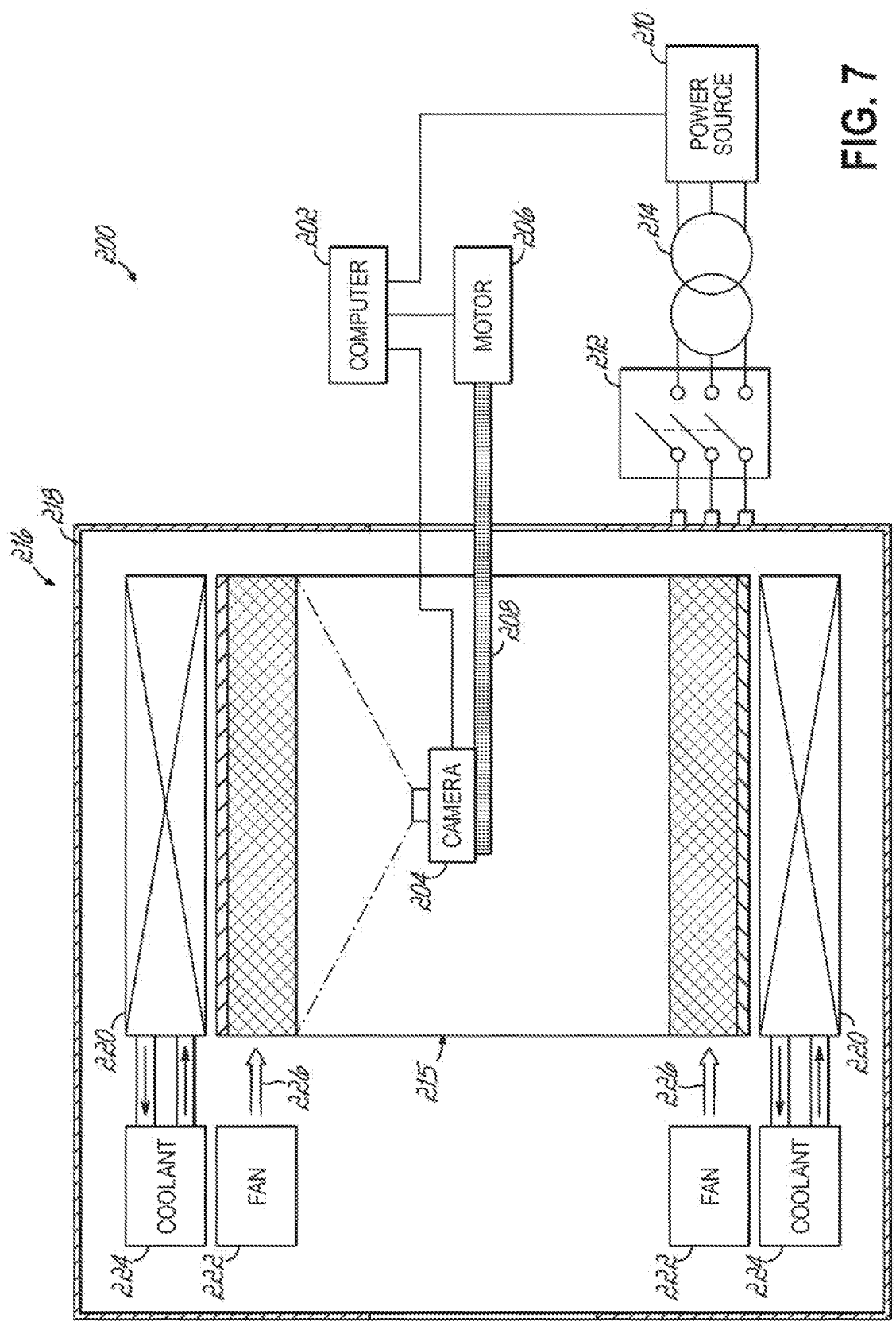
FIG. 7 is a diagrammatic view of a test setup which may be used to perform thermal domain testing of the electric machine of FIGS. 1 and 2.

FIG. 7 depicts an exemplary thermal domain test setup 200 that may be used for testing electric machines or their components. The test setup 200 may include a computer 202, a thermal imaging camera 204 operatively coupled to a motor 206 by a shaft 208, a power source 210 (e.g., the power grid), a power control device 212 (such as a Silicon Controlled Rectifier (SCR)), and a transformer 214. The power control device 212 may be operatively coupled to the power source 210 by transformer 214. The computer 202 may be operatively coupled to the thermal imaging camera 204, motor 206, and power control device 212 to control testing and collect data.

The transformer 214 may be a high-current transformer configured to adjust the voltage provided by the power source 210. The transformer 214 may develop full-load alternating current (e.g., 3-phase current) at a fraction of the power rating of the electric machine (e.g., using approximately 1 to 2% of the rated power) so that a full load alternating current can be provided to the device under test, e.g., a stator 215. The voltage output by the transformer 214 may be selectively applied to the stator 215 by the power control device 212 (e.g., through pulse-width modulation of the voltage) to stimulate the stator 215.

The test setup 200 may be configured to accept a frame assembly 216 that includes the stator 215, a housing 218, cooling pods 220, fans 222, as well as any other electrically excited parts of the electric machine. The cooling pods 220 may be operatively coupled to a source of coolant 224 and the fans 222 configured to provide cooling air 226 to the stator 215 during testing so that the test setup 200 provides a level of cooling similar to that found in the operating environment of the frame assembly 216.

The frame assembly 216 may be placed in the test setup 200 without a rotor. The absence of the rotor may facilitate inserting the thermal imaging camera 204 into the stator 215. The windings of the stator 215 may be electrically coupled to the power source 210 via the transformer 214 and power control device 212 so that the computer 202 can control the amount of power provided to the stator 215. The amount of power provided to the stator 215 may vary depending on the size and intended application of the electric machine. By way of example, a stator 215 from a generator that outputs 12 MW at 12 kA may be stimulated with 200 kW of power during thermal domain testing.

During the test, the computer 202 may cause the motor 206 to rotate the thermal imaging camera 204 to obtain a 360 degree thermal image of the interior of the stator 215, i.e., the "central windings". The thermal imaging camera 204, or one or more additional thermal imaging cameras (not shown), may also be moved or positioned to capture thermal images of the ends of stator 215, i.e., the "end windings". The computer 202 may convert the 360 degree thermal image into a thermal map comprising a plurality of cells. Each cell entry in the thermal map may then be compared to a corresponding cell in a reference thermal map generated for the reference machine. This comparison may include generating a thermal divergence map including cells that show the difference in temperature between each cell in the test thermal map and its corresponding cell in the reference thermal map. The thermal divergence map could in turn identify the level of consistency between electric machines as well as the acceptability of each electric machine for release. This approach to thermal testing may provide better information than a load test because it provides thermal data on the entire frame assembly 216 rather than only where thermal sensors are located. The thermal map may thereby provide a thermal signature for the electric machine which can be compared to a thermal signature of the reference machine.

The thermal imaging camera 204 may generate a two-dimensional map of temperatures of the device under test. By moving the camera, a three-dimensional representation of the thermal response of the device under test can be generated. Thermal images captured by the thermal imaging camera 204 may be converted into a thermal signature of the device under test that is used as a basis for comparison of the electric machine to other electric machines, such as the reference machine. Advantageously, thermal images may be capable of providing thermal data having higher spatial resolution than is practical with embedded temperature probes. This higher resolution thermal data may be used to generate one or more thermal parameters that are representative of the overall thermal response of the device under test. These thermal parameters may be used as part of a test signature that includes parameters generated by other physical domain tests.

As described above with respect to magnetic flux maps, thermal maps generated for devices under test may be compared to thermal maps generated from the reference machine prior to load-testing. Thermal domain testing may be performed separately for any suitable component of the electric machine, such as the stator and rotor. For electric machines using permanent magnets, thermal domain testing may only need to be performed on the component containing the windings, typically the stator. Thermal domain testing of the stator independently of the rotor may allow the entire cylindrical surface of the stator to be mapped, including end-turns, cores, power leads, bus rings, terminations etc. The spatial resolution of thermal domain testing using thermal images may be higher than testing based on thermal data obtained from discrete temperature sensors. Thermal image data may also avoid variability in data due to variations in the placement of temperature sensors in the device under test.

Data extracted from thermal maps of a production machine may be compared with temperature data obtained from temperature sensors integrated in the electric machine. This data comparison may include generating a machine specific correlation between the thermal map of the assembly and the temperature sensors of that assembly. The temperature sensors in each assembly may thereby be calibrated. This calibration may in turn improve the accuracy of thermal monitoring of the electric machine in operation as compared to electric machines that have not been calibrated. Thermal maps of production units may also be compared to thermal maps from reference machines to show equivalence. Similarly, thermal maps may be developed before and after load-testing of the reference machine to determine what degree of variability, if any, is present, and to characterize aging and wear characteristics of the reference machine.

Thermal domain testing may include tests that produce data indicative of the thermal properties of the electric machine or a component of the electric machine. Thermal properties may include the ability of the electric machine to dissipate heat generated by electrical losses at rated output and ambient temperature. In some embodiments, thermal images of components of the electric machine (e.g., stator, rotor, etc.) may be obtained while the components are being provided with currents comparable to rated conditions. These thermal images can then be used to determine the thermal response of the component.

Figure 8:
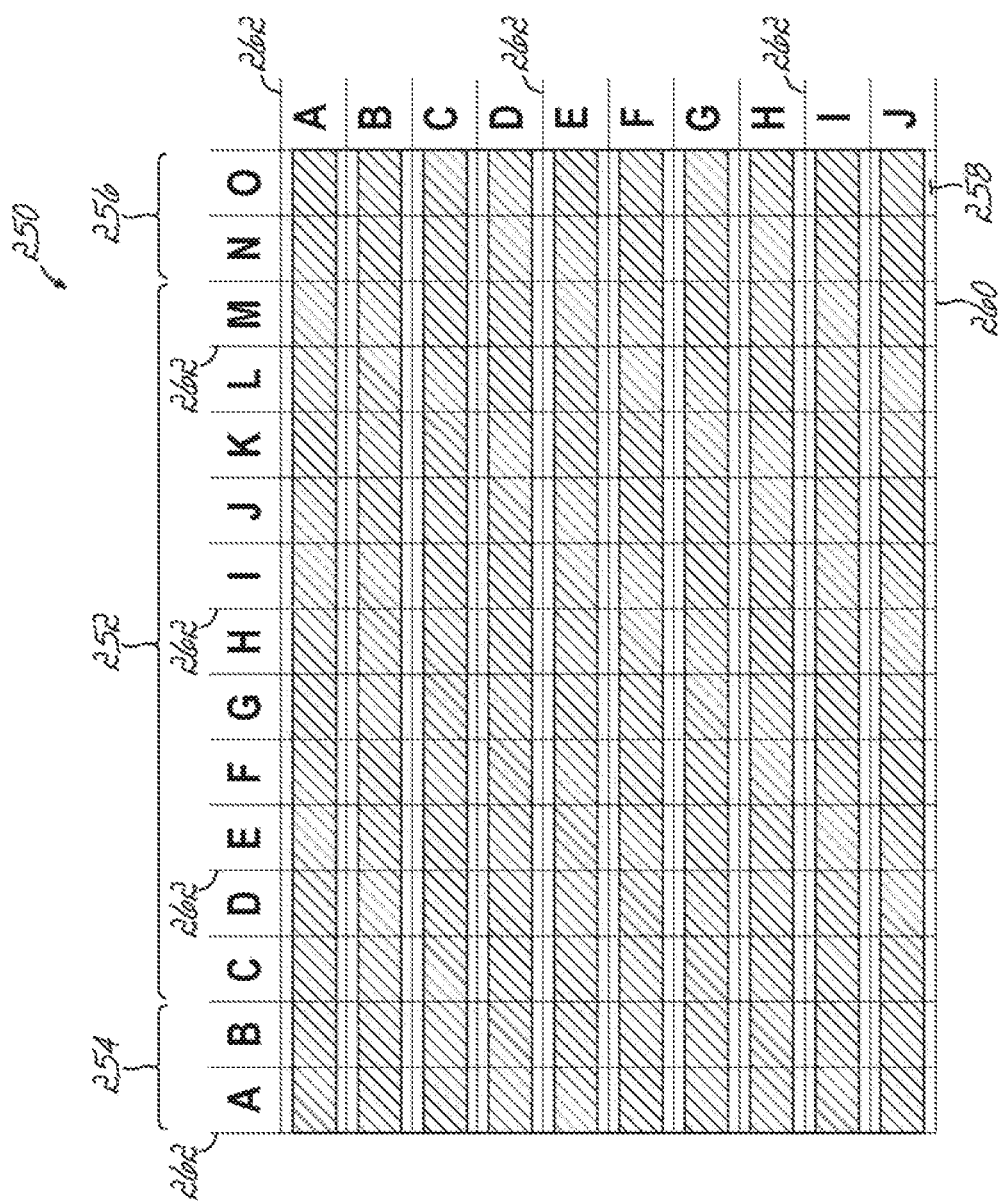
FIG. 8 is a diagrammatic view of a thermal map which may be generated using the test setup of FIG. 7.

FIG. 8 is a diagrammatic view depicting an exemplary thermal map 250 of the stator 215. The thermal map 250 includes a central winding region 252 corresponding to the central windings of the stator 215, and two end winding regions 254, 256 corresponding to the end-windings of the drive end and the end windings of the non-drive end of stator 215, respectively. The thermal map 250 may be divided into cells 258 by a grid 260 including grid lines 262. The location of each cell 258 of thermal map 250 may be identified by a row and column (e.g., AA, AB, AC etc.). Each cell 258 may be associated with one or more temperature parameters for the surface of the stator 215 in a region corresponding to the portion of the thermal map 250 defined by the cell 258.

The cells 258 may be any suitable size, and may be categorized into regions that correspond to specific parts of the stator 215. These regions may include the end winding regions 254, 256, central winding region 252, or regions corresponding to specific components of the stator 215. Specific components of the stator 215 may include the teeth, slots between the teeth, specific portions of the windings, and electrical connections to the outside such as a bus ring, power leads, etc. These regions may be analyzed to identify individual hot spots, an average temperature within each region, and an overall average temperature of the thermal map 250.

Stimulating the stator 215 by feeding electrical energy into the stator 215 allows the rotor to be removed during testing. Advantageously, this testing configuration enables the thermal imaging camera 204 to image the interior surface of the stator 215. This allows high resolution thermal data to be measured directly for the bore or inside diameter (in the case of a radial field machine) using the thermal imaging camera 204.

Although the above description has been focused on a stator for a radial field electric machine, it should be understood that the above described techniques can be used with other topologies, e.g., electric machines having an outer rotor, axial field electric machines, etc. The above described techniques can also be used to test other components of an electric machine, e.g., a rotor having magnetic poles provided by electro-magnets or that comprises the windings of the electric machine. It should be further understood that measurements may be done on a transient basis or thermal steady state basis. Testing scenarios may include testing with the cooling system in place and operational, with the cooling system disabled, or to determine the thermal effects of disabling the cooling system after the electric machine has reached thermal equilibrium.

Parameter values extracted from the thermal map 250 may be numerically processed to provide a quantitative basis for comparing the thermal parameters of a production machine to those of a reference machine. To this end, thermal parameters of the production machine may be obtained from a thermal map 250 thereof and compared to those of the reference machine. This comparison may be made using thermal parameters obtained with the same grid lines 262, mapping coordinate system, test conditions for stimulation and cooling of the electric machines, and the same time steps in the case of transient measurements.

It should be understood that steady state and transient thresholds may reveal the quantitative similarity of a production machine to its reference machine counterpart on a variety of underlying physical characteristics. These characteristics may include loss characteristics of the stator core and conductor components, the thermal inertia (specific heat & density) and thermal conductivity of the components of the device under test, and the effectiveness of the cooling system and thermal impedance between each source of heat and the cooling medium.

Mechanical Domain Testing

Mechanical domain testing characterizes the mechanical properties of the device under test in a static sense. A number of mechanical tests may be performed to ensure consistency between the electric machine being evaluated and the reference machine. These mechanical tests may include tests in which a time varying force, a static force, or some combination of time varying and static forces are applied to the device under test. The response of the device under test may then be characterized and compared to the response of the reference machine or one of its components to the same test conditions.

One type of mechanical domain testing is vibration testing. Vibration testing involves coupling energy in the form of a mechanical forcing function into the device under test. This can be accomplished by attaching the device under test to a shaker table. However, a vibration test setup using a shaker table for a device with a mass on the order of a wind turbine generator could be as expensive as, or even more expensive than, a full-load qualifying test setup.

To avoid the impracticality of a vibration test setup using a shaker table, one or more exciters (e.g., inertial exciters) may be coupled to the stator, rotor, or other device under test, to stimulate the device under test. The response of the device under test to the mechanical forcing function stimulus can then be characterized by measuring movement of one or more portions of the device under test.

Figure 9:
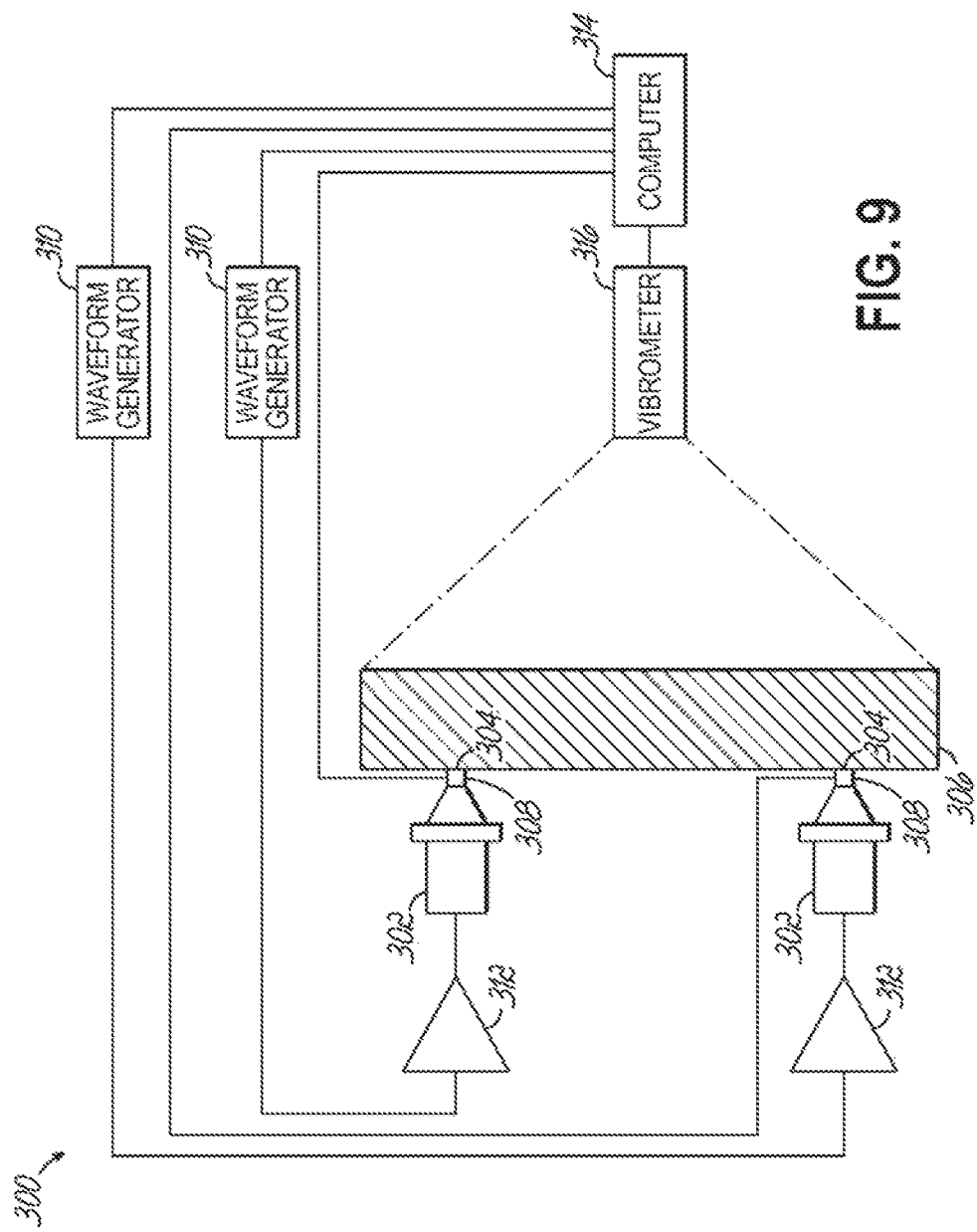
FIGS. 9-11 are diagrammatic views of test setups which may be used to perform mechanical domain testing of the electric machine of FIGS. 1 and 2.

FIG. 9 depicts an exemplary mechanical domain test setup 300 in accordance with an embodiment of the invention. The test setup 300 includes one or more (e.g., two) exciters 302 each coupled to a respective input point 304 of a device under test 306. A vibration sensor 308 (e.g., an accelerometer) located proximate to each input point 304 may provide a signal indicative of an amount of energy being introduced into the device under test 306 at the input point 304. The test setup 300 may further include one or more (e.g., two) waveform generators 310 that generate specified forcing functions. The output of each waveform generator 310 may be operatively coupled to a respective exciter 302 by an amplifier 312. Each amplifier 312 may be configured to amplify the driving function so that the exciter 302 is provided with sufficient power to operate properly. A computer 314 configured to control the test setup 300 may be operatively coupled to each vibration sensor 308 and waveform generator 310, as well as a vibrometer 316 (e.g., a Scanning Laser Doppler Vibrometer (SLDV)) or other device configured to measure the response of the device under test 306 to the mechanical forcing functions provided by the exciters 302.

Each exciter 302 may include a transducer that delivers a time varying force having a controlled frequency content and amplitude. Each exciter 302 may be rigidly coupled to the device under test 306 at a predetermined position and with a predetermined orientation. The position and orientation of the exciter 302 may be selected so that the mechanical forcing function is introduced into the device under test at a desired point and with a desired vector.

The mechanical forcing function provide by each exciter 302 may have a phase, frequency content, and amplitude corresponding to the electrical forcing function provided by the respective waveform generator 310.

For forcing functions with a frequency content limited to frequencies below about 100 Hz, exciters 302 having servo-hydraulic or pneumatic transducers may be used. For forcing functions including frequencies in the range of about 5 Hz to 2000 Hz, exciters 302 having electrodynamic transducers may be used. The energy output of the exciter 302 may be controlled by the computer 314 to maintain a predetermined amount of acceleration at the input point 304 of the device under test 306.

While the exciters 302 are stimulating the device under test 306, the response of the device under test 306 to the mechanical forcing functions may be characterized using the vibrometer 316. For embodiments of the invention that use a laser Doppler vibrometer, the vibrometer 316 may measure vibration of a surface of the device under test 306 using a laser beam directed at the surface. The amplitude and frequency of the vibration can then be determined based on the Doppler shift of the reflected laser beam due to the motion of the surface. Laser Doppler vibrometers may thereby develop a real time multi-dimensional vibration map that shows the response of the device under test 306 to selective stimulation by the exciters 302. Standing waves as well as transient vibrations can be mapped from a three-dimensional image of the device under test 306. In an alternative embodiment of the invention, the response of the device under test 306 may be determined using one or more vibration sensors (e.g., accelerometers) mounted to the device under test 306. The spatial resolution of vibration map for this alternative embodiment may be limited by the number points on the device under test 306 monitored by the vibration sensors.

The vibration map of the device under test 306, or "test vibration map", may be compared to a reference vibration map obtained by testing the same component from a reference machine under the same test conditions. Anomalies in the test vibration map may indicate improper pre-loads, material properties, joint continuity, imbalances, etc.

Another exemplary mechanical test is commonly known as a free vibration test, sometimes referred to as a "bump test". A free vibration test provides an initial stimulus to the device under test 306, e.g., an impulse. The device under test 306 is then allowed to vibrate freely, or "ring down". Free vibration tests may be used to identify resonance frequencies and damping characteristics of the device under test 306.

Mapping the vibration levels throughout the device under test 306 and comparing these levels against those obtained from testing of the same device from the reference machine may provide mechanical consistency sufficient to satisfy factory acceptance testing requirements. The above described mechanical domain tests may also provide information analogous to that of non-destructive ultrasonic tests which are used to evaluate composites or welded assemblies.

Vibration mapping of an electric machine component (such as the rotor or stator) may be carried out in a similar manner as discussed above with respect to thermal mapping. A stimulus is introduced into the device under test (e.g., the forcing function), a map of the response of the device under test to the stimulus is sampled and stored as a digital data file. The map is then compared to a map obtained from the corresponding component from the reference machine, which has already been proven to satisfy all of the performance requirements for factory acceptance. Quantitative criteria may be applied on a cell by cell basis to the production machine component to confirm that the production machine component has equivalent quality to the corresponding component of the reference machine.

As compared to the thermal domain in which the stimulus is provided by feeding electrical energy into the device under test, in the mechanical domain, the stimulus is provided by feeding kinetic energy into the device under test. Accordingly, the response function is a vibration on the surface of the device under test rather than a temperature distribution. Another aspect that can distinguish the mechanical domain from the thermal domain is that the input energy used to excite the device under test, and the response of the device under test, may have additional parameters not present in the thermal domain.

Thermal domain stimuli are characterized primarily by amplitude, i.e., the amount of electrical power provided to the windings. Likewise, the thermal domain response is primarily characterized by the temperature of the device under test. The analogous amplitude variable in the mechanical domain is the amplitude of the forcing function that is provided to the input points, and the amount of movement which results in the device under test. However, vibration testing may include forcing function and movement vectors. That is, the forcing function and resulting movement of the device under test may include movement components oriented along different axes each having a different orientation.

Accordingly, vibration testing may include stimulating the device under test with a "stimulation pattern" that is provided by a plurality of exciters each introducing a respective forcing function at a different input point and oriented along a different vector axis. Each of the exciters may generate a mechanical forcing function having an amplitude, frequency, and phase relationship which is uniquely defined for a given stimulation pattern. The forcing functions may be applied one at a time or simultaneously. The response pattern as measured in individual cells of the response map may also have individual amplitude, frequency, and phase characteristics on a cell by cell basis.

Figure 10:
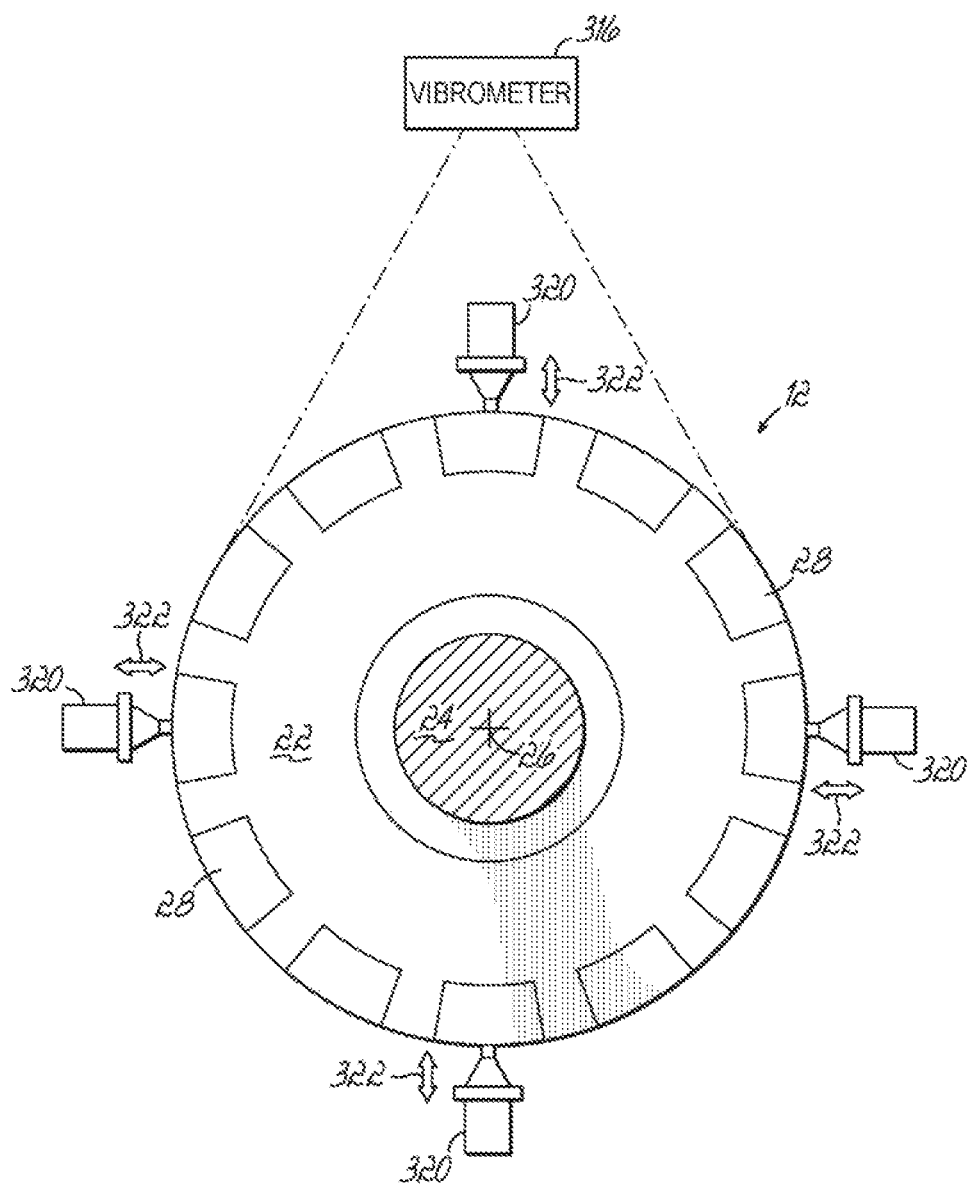
Figure 11:
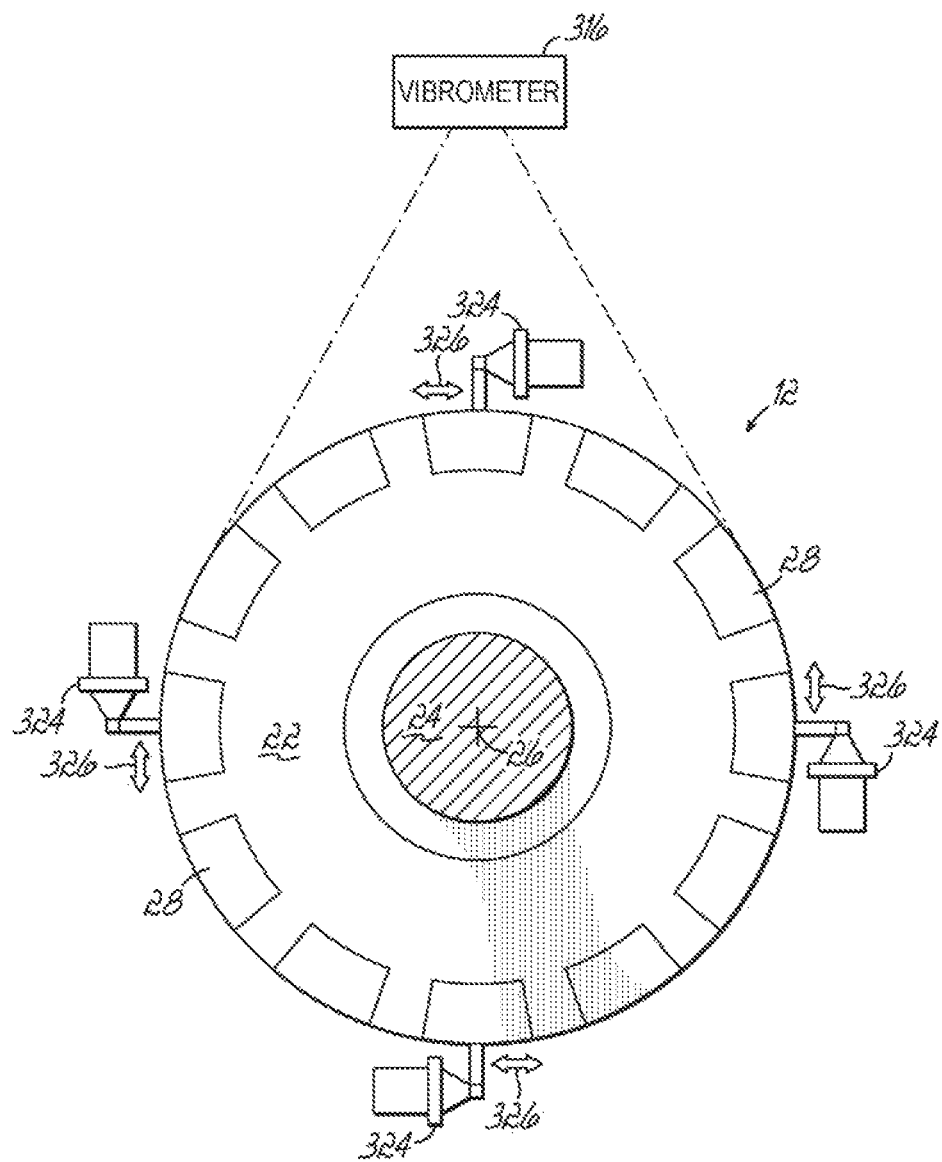
Figure 12:
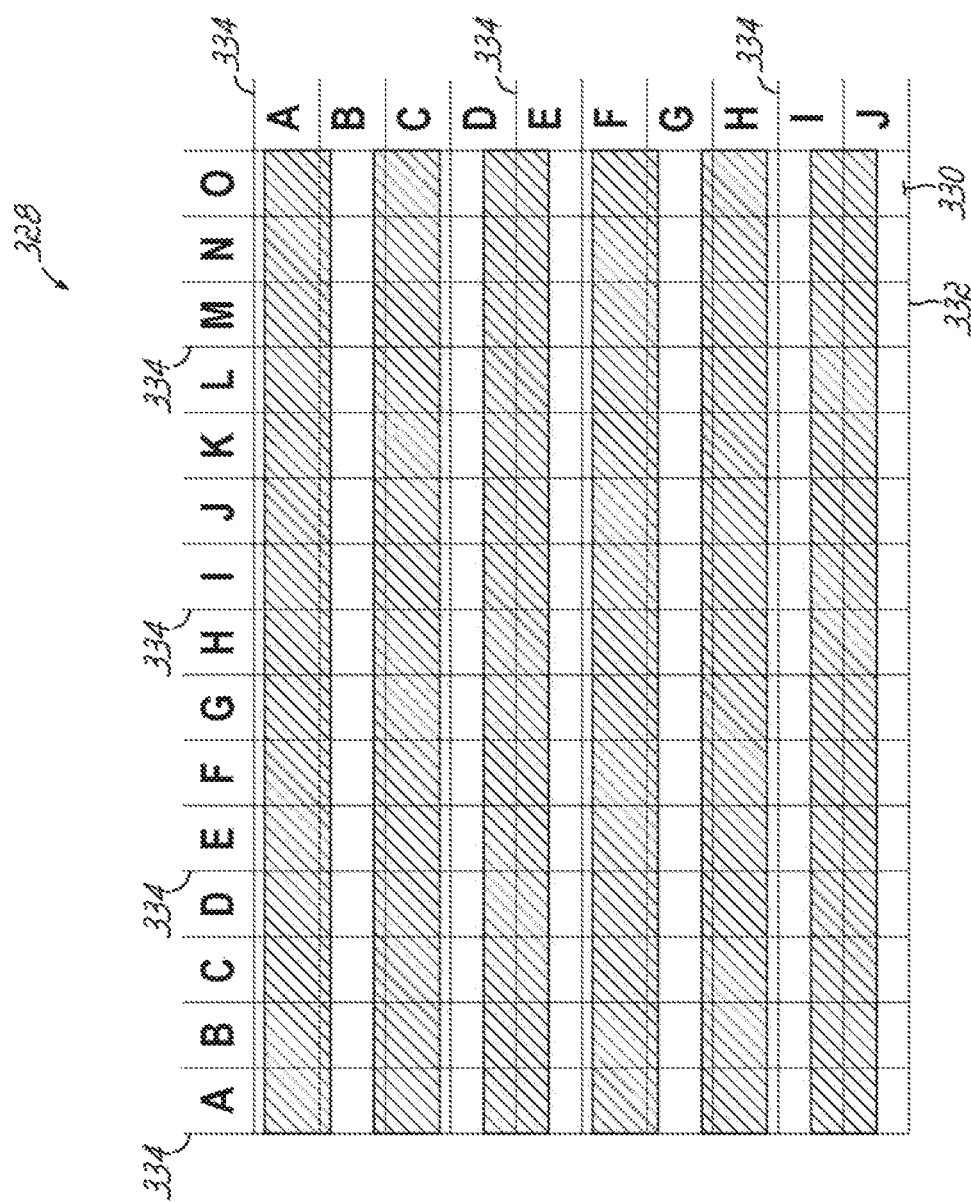
FIG. 12 is a diagrammatic view of a vibration map which may be generated using the test setups of FIGS. 8-10.
Figure 13:
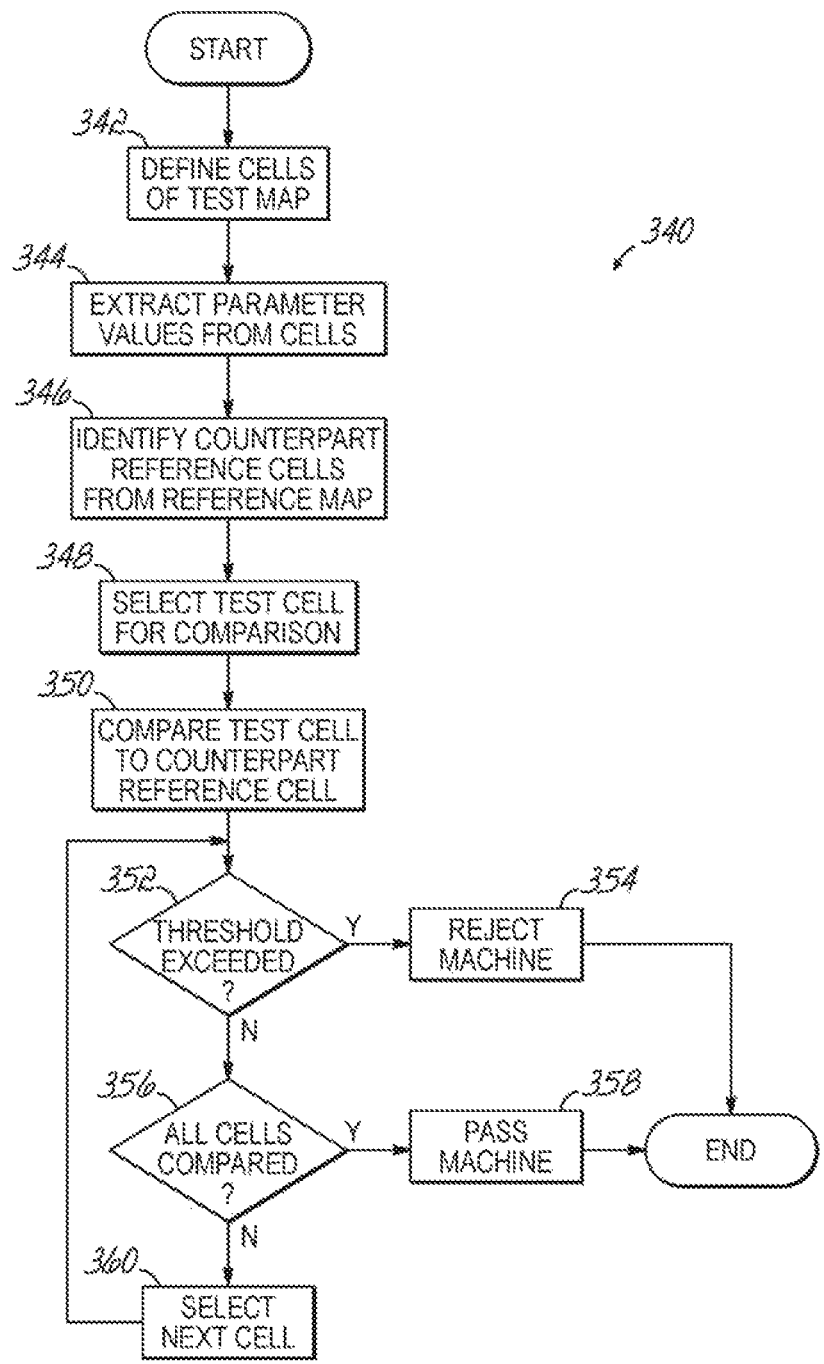
FIG. 13 is a flowchart of a process for comparing a test map obtained from a device under test to a reference map obtained from the reference machine.

Referring now to FIGS. 10-12, in FIG. 10, an exemplary device under test in the form of the rotor 12 may be excited by a plurality of exciters 320 configured to provide mechanical forcing functions 322 oriented along radial axes. In FIG. 11, the rotor 12 is depicted as being excited by a plurality of exciters 324 configured to provide mechanical forcing functions 326 oriented along tangential axes. In each case, either the rotor 12 or the vibrometer 316 may be rotated about the longitudinal axis 26 of rotor 12 so that the vibrometer 316 captures a vibration response image of the entire outer surface of the rotor 12.

The mechanical forcing functions 322, 326 may be in phase or out of phase, may be applied independently or simultaneously, and may include multiple frequencies. In addition, it should be understood that the number, position, and orientation of the mechanical forcing functions 322, 326 is exemplary only. Thus, embodiments of the invention are not limited to any specific number, type, or orientation of mechanical forcing functions.

The exciters 320, 324 may be oriented to stimulate different parameters of the device under test. For example, by placing exciters 320 radially and synchronizing the mechanical forcing functions 322 so that the functions are in-phase, a response to radially symmetric forces may be stimulated in the device under test. This stimulation pattern may allow observation of vibration responses that are associated with centrifugal force. If the exciters 320 are driven so that the mechanical forcing functions 322 are out of phase, a response to radial perturbations may be stimulated in the device under test. This out of phase stimulation pattern may allow observation of vibration responses that could be associated with forces acting on the magnetic poles 28 as the rotor 12 rotates, an out-of-round condition of the rotor 12, etc.

Placing exciters 324 so that the mechanical forcing functions 326 have a vector tangential to the rotor 12 as depicted by FIG. 11 may enable phenomena associated with torque to be observed. A combination of radially and tangentially oriented exciters 320, 324 may be configured to apply mechanical forcing functions with vectors that are off-axis to the rotor 12. This type of stimulation pattern may be used to simulate the response of the rotor 12 to loading from gravity or critical speed bending, for example.

Different stimulation patterns may be used to stimulate various operating conditions encountered by the device under test. The number of exciters, their orientation, the phase, frequency, and amplitude of the forcing functions, as well as how mechanical supports or restraints of device under test are configured can be modified depending on the degree of complexity that is to be simulated. For example, an array of exciters configured to provide radially oriented mechanical forcing functions to a component (e.g., the rotor) could be used to stimulate operating conditions associated with centrifugal force. Similarly, tangentially oriented exciters could be configured to simulate torque loads on components of the electric machine experienced under operating conditions.

It should be understood that mechanical domain virtual machine testing can be done separately for the stator 10, rotor 12, housing, or any other component of an electric machine being tested, or can be applied to a complete machine. Furthermore, it should be understood that thermal and mechanical domain virtual machine testing can be done at the same time so that the vibration response of the device under test can be tested at the elevated temperatures expected under operating conditions.

The vibration response image may provide a basis for generating a vibration map. FIG. 12 depicts an exemplary vibration map 328 that is divided into cells 330 by a grid 332 including grid lines 334. The grid 332 may be spatially linked to the geometry of the device under test so that the distribution of cells 330 is the same for each production machine and the reference machine. The location of each cell 330 of vibration map 328 may be identified by a row and column (e.g., AA, AB, AC etc.). Each cell 330 may be associated with one or more vibration parameters for the surface of the rotor 12 in a region corresponding to the portion of the vibration map 328 defined by the cell 330.

Each vibration response parameter may be stored as an n-dimensional datafile that characterizes a response $R_a(E_b, f_c, A_d, \phi_e)$ of cell a when a stimulation pattern $E_b$ is applied to the device under test. Subscript b may identify which stimulation pattern (e.g., $E_1, E_2, \ldots E_n$) is stimulating the device under test. Variations in the stimulation pattern may include the number of exciters used, the location of each input point to which an exciter is coupled, the orientation, amplitude, phase, and frequency content of the mechanical forcing function provided by each exciter, and other conditions such as temperature of or current being provided to the device under test (e.g., for combined mechanical and thermal domain testing). Additional elements of the response $R_a$ may include the frequency $f_c$, amplitude $A_d$, and phase $\phi_e$ of the vibration response associated with the cell 330.

The number cells 330 may be selected to provide a desired resolution and to cover certain regions of the vibration map 328. Each cell 330 may be associated with one or more values $f_c$ corresponding to one or more frequency components of the vibrations in the cell, an amplitude $A_d$ of the vibration, and a phase $\phi_e$, of the vibration. The subscripts d and e may indicate an axis in vector space along which a component of the displacement associated with the amplitude and phase values is aligned. The axes d and e may include an axis normal to the surface of the cell, an axis tangential to the surface of the cell along a first tangential axis, and an axis tangential to the surface of the cell along a second tangential axis orthogonal to the first tangential axis.

The directional components of the amplitude and phase may be determined by measuring the radial displacement along a line connecting the cell 330 to the vibrometer 316 from multiple positions. These positions may include a first position directly above the cell, a second position laterally offset from the first position along the first tangential axis, and a third position laterally offset from the first position along the second tangential axis. Each directional component can then be determined by applying the law of cosines to the radial displacements measured at each position. Thus, the vibration response $R_a(E_b, f_c, A_d, \phi_e)$ of the device under test for a given stimulation pattern $E_b$ may be compared to a vibration response $R_a(E_b, f_c, A_d, \phi_e)$ determined for the corresponding component of the reference machine when stimulated by the same stimulation pattern $E_b$ over multiple dimensions.

The above described vibration analysis may provide a quantitative and high fidelity indication of the level of equivalence between a production machine and the reference machine for each mechanical characteristic observed. Mechanically sensitive characteristics that may be used to show operational equivalence may include material densities, stiffness, damping factors, preloading of mechanical joints, discontinuities, voids, or other flaws in the production component. It should be understood that although the above description is for devices and materials having a linear response, the methods are equally applicable to non-linear systems where the input force amplitudes and output vibration amplitudes are independent variables.

As with the cells 258 of thermal map 250, the cells 330 of vibration map 328 may be any suitable size, and may be categorized into regions that correspond to specific parts of the device under test. These regions may be analyzed to identify individual regions having resonances, an average vibration response within each region, and an overall average vibration response of the vibration map 328. The vibration maps generated for devices under test may be compared to corresponding vibration maps generated from the reference machine to determine if the device under test is mechanically equivalent to the reference component.

Map Comparison

FIG. 12 depicts a flowchart illustrating an exemplary process 340 that may be used to compare a test map obtained from a device under test to the reference map obtained from the reference machine in accordance with an embodiment of the invention. In block 342, the process 340 may define one or more test cells for a map generated for the device under test. The test cells may be defined using a grid, e.g., by overlaying the grid onto the test map, or by any other pattern that identifies portions of the map from which data is to be extracted for use in evaluating the device under test. The cells may have the same size, dimensions, and positions as used to define corresponding reference cells for the reference map. The cells may cover the full test and reference maps, or only portions of the respective maps considered to be key regions for evaluating the device under test.

Once the test cells have been defined, the process 340 may proceed to block 344 and extract one or more parameter values from each test cell. These parameter values may include one or more of a mean value, a median value, maximum value, a minimum value, etc. of a parameter enclosed by the test cell. That is, the parameter values may be determined for each test cell based on data corresponding to the portion of the map defined by the cell. These values may correspond, for example, to the intensity of pixels comprising the portion of a test image used to generate the map. Exemplary values may be indicative of magnetic flux density, magnetic flux orientation, temperature, temperature gradient, surface displacement, or any other parameter of the portion of the test device corresponding to the cell in question.

In block 346, the process 340 may identify counterpart reference cells from the reference map. This identification process may include aligning the test map with the reference map. The test cells used for the comparison may be those that are aligned with predetermined reference cells selected for the process 340. By way of example, the maps may be aligned by performing a spatial convolution between the test map and the reference map. The test map may then be considered as being aligned with the reference map at the relative position that provides the best correlation between the maps. It should be understood that the extraction of parameter values and identification of counterpart reference cells may be in iterative process.

For example, data may be initially extracted from one or more test cells in order to align the test map with the reference map. Additional or supplemental data for determining parameter values and comparing the maps may then be extracted once the maps are aligned.

In block 348, the process 340 may select a test cell before proceeding to block 350 and comparing the test cell to its counterpart reference cell. Comparing the test cell to the reference cell may include comparing parameter values extracted from the test cell to parameter values extracted from the counterpart reference cell. If there is a difference in the parameter values that exceeds a threshold ("YES" branch of decision block 352), the process 340 may proceed to block 354, reject the test device, and terminate. If the difference in the parameter values does not exceed the threshold ("NO" branch of decision block 352), the process 340 may proceed to block 356.

In an alternative embodiment of the invention, if the threshold is exceeded, the process 340 may continue to compare remaining test cells to their counterpart reference cells in order to fully characterized the device under test prior to terminating. Performing a full comparison between the test map and the reference map may facilitate repair of the device under test by identifying regions of the device that need attention.

The threshold may be a predetermined threshold that applies to each test cell (e.g., one test cell exceeding the threshold causes the test machine to be rejected), or a cumulative threshold which a number of cells or cumulative test error must exceed before the test machine is rejected. By way of example, when comparing thermal maps, if the test cell thermal parameter (e.g., temperature) has a value within $\pm X°$ C. of the counterpart reference cell thermal parameter, the process 340 may determine the threshold has not been exceeded for that test cell. As another example, if the average of the thermal parameters from a plurality of test cells in a region is within ±Y° C. of the average of the thermal parameters of the counterpart reference cells, the process 340 may determine that the threshold has not been exceeded for that region of the thermal map. By way of yet another example, if the average of the thermal parameters for the entire test thermal map is within ±Z° C. of the average of the thermal parameters for the reference machine map, the process 340 may determine the threshold has not been exceeded. In any case, the process 340 may include multiple thresholds which are applied to multiple regions, with each region comprising one or more cells which may or may not be included in another region. That is, regions may overlap.

Thresholds may use a linear scale as described above in the thermal map examples, or a logarithmic scale. Threshold values on a logarithmic scale may convert values associated with each cell to decibels (dB) for comparison. Thresholds for acceptable differences in the values may then be defined in terms of decibels. An exemplary acceptance criterion might be that all values measured for the device under test must be within ±2 dB of the corresponding values obtained from the reference machine.

The above thresholds may be set to different levels depending on the type of electric machine and the application. A typical threshold level for a thermal map may be ±5° C. As another example, a typical threshold for a vibration map may be ±2 dB. Moreover, maps may be compared on a steady state basis under equivalent conditions or on a transient basis where the rates of change in the value of a parameter from a given starting point are evaluated.

Rates of change may be particularly relevant parameters in thermal testing. For example, the rate of change in temperature in a cell in response to shutting off a cooling fan or changing the amount of power provided to the device under test application may be compared as part of a virtual machine test.

In block 356, the process 340 may determine if all test cells have been compared to their counterpart reference cells. If all the cells have been compared ("YES" branch of decision block 356), the process 340 may proceed to block 358, pass the device under test, and terminate. If all the test cells have not been compared to their counterpart reference cells ("NO" branch of decision block 356), the process 340 may proceed to block 360, select the next test cell, and return to block 350 to continue comparing test cells to counterpart reference cells.

Validation Matrix

Once the physical domain data for a specific test has been obtained, it may be entered into a validation matrix. The validation matrix may serve as a virtual machine test signature by breaking down each key parameter of the physical domain tests (e.g., magnetic, electrical, thermal, and vibration comparison results), and how they are confirmed by the virtual machine tests. Once the overall design of the electric machine has been validated using one or more full-load tests, the validation matrix can be designed to check every design or assembly aspect that indicates to what level the respective parameter has been confirmed by the virtual machine test. Key parameters may be identified, for example, by comparing the results of physical domain tests for electric machines that passed qualification testing to machines which failed testing or are otherwise known to have defects.

Figure 14:
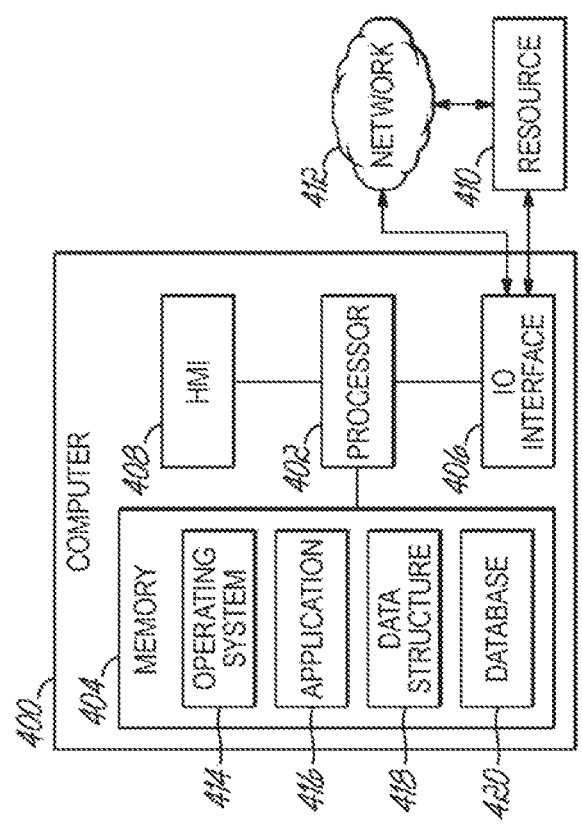
FIG. 14 is a diagrammatic view of a computer that may be used to implement one or more of the test setups, processes, systems, or maps depicted in FIGS. 3-13.

Referring now to FIG. 14, embodiments of the invention described above, or portions thereof, may be implemented using one or more computer devices or systems, such as exemplary computer 400. The computer 400 may include a processor 402, a memory 404, an input/output (I/O) interface 406, and a Human Machine Interface (HMI) 408. The computer 400 may also be operatively coupled to one or more external resources 410 via the network 412 or I/O interface 406. External resources may include, but are not limited to, servers, databases, mass storage devices, peripheral devices, cloud-based network services, or any other resource that may be used by the computer 400.

The processor 402 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in memory 404. Memory 404 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or data storage devices such as a hard drive, optical drive, tape drive, volatile or non-volatile solid state device, or any other device capable of storing data.

The processor 402 may operate under the control of an operating system 414 that resides in memory 404. The operating system 414 may manage computer resources so that computer program code embodied as one or more computer software applications, such as an application 416 residing in memory 404, may have instructions executed by the processor 402. In an alternative embodiment, the processor 402 may execute the application 416 directly, in which case the operating system 414 may be omitted. One or more data structures 418 may also reside in memory 404, and may be used by the processor 402, operating system 414, or application 416 to store or manipulate data.

The I/O interface 406 may provide a machine interface that operatively couples the processor 402 to other devices and systems, such as the external resource 410 or the network 412. The application 416 may thereby work cooperatively with the external resource 410 or network 412 by communicating via the I/O interface 406 to provide the various features, functions, applications, processes, or modules comprising embodiments of the invention. The application 416 may also have program code that is executed by one or more external resources 410, or otherwise rely on functions or signals provided by other system or network components external to the computer 400. Indeed, given the nearly endless hardware and software configurations possible, persons having ordinary skill in the art will understand that embodiments of the invention may include applications that are located externally to the computer 400, distributed among multiple computers or other external resources 410, or provided by computing resources (hardware and software) that are provided as a service over the network 412, such as a cloud computing service.

The HMI 408 may be operatively coupled to the processor 402 of computer 400 to allow a user to interact directly with the computer 400. The HMI 408 may include video or alphanumeric displays, a touch screen, a speaker, and any other suitable audio and visual indicators capable of providing data to the user. The HMI 408 may also include input devices and controls such as an alphanumeric keyboard, a pointing device, keypads, pushbuttons, control knobs, microphones, etc., capable of accepting commands or input from the user and transmitting the entered input to the processor 402.

A database 420 may reside in memory 404, and may be used to collect and organize data used by the various systems and modules described herein. The database 420 may include data and supporting data structures that store and organize the data. In particular, the database 420 may be arranged with any database organization or structure including, but not limited to, a relational database, a hierarchical database, a network database, or combinations thereof. A database management system in the form of a computer software application executing as instructions on the processor 402 may be used to access the information or data stored in records of the database 420 in response to a query, which may be dynamically determined and executed by the operating system 414, other applications 416, or one or more modules.

In general, the routines executed to implement the embodiments of the invention, whether implemented as part of an operating system or a specific application, component, program, object, module or sequence of instructions, or a subset thereof, may be referred to herein as "computer program code," or simply "program code." Program code typically comprises computer-readable instructions that are resident at various times in various memory and storage devices in a computer and that, when read and executed by one or more processors in a computer, cause that computer to perform the operations necessary to execute operations or elements embodying the various aspects of the embodiments of the invention. Computer-readable program instructions for carrying out operations of the embodiments of the invention may be, for example, assembly language, source code, or object code written in any combination of one or more programming languages.

Various program code described herein may be identified based upon the application within which it is implemented in specific embodiments of the invention. However, it should be appreciated that any particular program nomenclature which follows is used merely for convenience, and thus the invention should not be limited to use solely in any specific application identified or implied by such nomenclature. Furthermore, given the generally endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the embodiments of the invention are not limited to the specific organization and allocation of program functionality described herein. The program code embodied in any of the applications/modules described herein is capable of being individually or collectively distributed as a computer program product in a variety of different forms. In particular, the program code may be distributed using a computer-readable storage medium having computer-readable program instructions thereon for causing a processor to carry out aspects of the embodiments of the invention.

Computer-readable storage media, which is inherently non-transitory, may include volatile and non-volatile, and removable and non-removable tangible media implemented in any method or technology for storage of data, such as computer-readable instructions, data structures, program modules, or other data. Computer-readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store data and which can be read by a computer. A computer-readable storage medium should not be construed as transitory signals per se (e.g., radio waves or other propagating electromagnetic waves, electromagnetic waves propagating through a transmission media such as a waveguide, or electrical signals transmitted through a wire). Computer-readable program instructions may be downloaded to a computer, another type of programmable data processing apparatus, or another device from a computer-readable storage medium or to an external computer or external storage device via a network.

Computer-readable program instructions stored in a computer-readable medium may be used to direct a computer, other types of programmable data processing apparatuses, or other devices to function in a particular manner, such that the instructions stored in the computer-readable medium produce an article of manufacture including instructions that implement the functions, acts, or operations specified in the flowcharts, sequence diagrams, or block diagrams. The computer program instructions may be provided to one or more processors of a general purpose computer, a special purpose computer, or other programmable data processing apparatus to produce a machine, such that the instructions, which execute via the one or more processors, cause a series of computations to be performed to implement the functions, acts, or operations specified in the text of the specification, flowcharts, sequence diagrams, or block diagrams.

The flowcharts and block diagrams depicted in the figures illustrate the architecture, functionality, or operation of possible implementations of systems, methods, or computer program products according to various embodiments of the invention. In this regard, each block in the flowchart or block diagrams may represent a module, segment, or portion of instructions, which comprises one or more executable instructions for implementing the specified logical function or functions.

In certain alternative embodiments, the functions, acts, or operations specified in the flowcharts, sequence diagrams, or block diagrams may be re-ordered, processed serially, or processed concurrently consistent with embodiments of the invention. Moreover, any of the flowcharts, sequence diagrams, or block diagrams may include more or fewer blocks than those illustrated consistent with embodiments of the invention. It should also be understood that each block of the block diagrams or flowcharts, or any combination of blocks in the block diagrams or flowcharts, may be implemented by a special purpose hardware-based system configured to perform the specified functions or acts, or carried out by a combination of special purpose hardware and computer instructions.

The terminology used herein is for the purpose of describing particular embodiments only and is not intended to be limiting of the embodiments of the invention. As used herein, the singular forms "a", "an" and "the" are intended to include both the singular and plural forms, and the terms "and" and "or" are each intended to include both alternative and conjunctive combinations, unless the context clearly indicates otherwise. It will be further understood that the terms "comprises" or "comprising," when used in this specification, specify the presence of stated features, integers, actions, steps, operations, elements, or components, but do not preclude the presence or addition of one or more other features, integers, actions, steps, operations, elements, components, or groups thereof. Furthermore, to the extent that the terms "includes", "having", "has", "with", "comprised of", or variants thereof are used in either the detailed description or the claims, such terms are intended to be inclusive in a manner similar to the term "comprising".

While all the invention has been illustrated by a description of various embodiments, and while these embodiments have been described in considerable detail, it is not the intention of the Applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the Applicant's general inventive concept.

The invention claimed is:

1. An apparatus for testing electric machines, comprising:
   one or more processors; and
   a memory coupled to the one or more processors and including program code that, when executed by the one or more processors, causes the apparatus to:
      measure a first value of a first parameter indicative of a response of at least one device under test to a static test;
      generate a test signature based at least in part on the first value of the first parameter;
      measure a second value of the first parameter indicative of the response of a reference device to the static test,
      generate a reference signature based at least in part on the second value of the first parameter;
      compare the test signature to the reference signature;
      pass the at least one device under test in response to the test signature matching the reference signature; and
      fail the at least one device under test in response to the test signature not matching the reference signature.

2. The apparatus according to claim 1, wherein the program code further causes the apparatus to:
   stimulate the at least one device under test with at least one stimulus,
   wherein the response of the at least one device under test is a reaction to the stimulus.

3. The apparatus of claim 2, wherein the at least one stimulus simulates an operating condition of the device under test.

4. The apparatus according to claim 1, wherein:
   the second value of the first parameter used to generate the reference signature is measured before the reference device is subjected to qualification testing,
   a third value of the first parameter used to generate the reference signature is measured after the reference device is subjected to qualification testing,
   a post-performance test signature is generated from the third value of the first parameter, and
   one or more of a reliability projection, a wear projection, or an aging projection for the reference device is determined by comparing the post-performance test signature to the reference signature.

5. The apparatus according to claim 1, wherein the test signature includes at least a portion of a test map of the at least one device under test, the reference signature includes at least a portion of a reference map of the reference device, and the first parameter of the at least one device under test is determined from the at least the portion of the test map.

6. The apparatus according to claim 5, wherein each test map and each reference map is divided into cells, and the first parameter of each cell of the test map is compared to the first parameter of a corresponding cell of the reference map.

7. The apparatus according to claim 1, wherein the first parameter defines a first physical property of a first physical domain, wherein the first physical domain is one of a magnetic domain, an electrical domain, a thermal domain, and a mechanical domain.

8. The apparatus according to claim 1, wherein the test signature includes at least a portion of a test thermal map of the at least one device under test, the reference signature includes at least a portion of a reference thermal map of the reference device, and the temperature of the at least one device under test is determined from the at least the portion of the test thermal map.

9. The apparatus according to claim 8, wherein each thermal map is divided into cells, and the temperature of each cell of the test thermal map is compared to the temperature of a corresponding cell of the reference thermal map.

10. The apparatus according to claim 8, wherein the at least one device under test includes one or more thermal sensors, and the test thermal map is used to calibrate the one or more thermal sensors.

11. The apparatus according to claim 1, wherein the at least one reference device includes a component of a reference machine which has passed full qualification testing.

12. An apparatus for testing electric machines, comprising:
   one or more processors; and
   a memory coupled to the one or more processors and including program code that, when executed by the one or more processors, causes the apparatus to:
      measure a first value of a first parameter indicative of a response of at least one device under test to a static test;
      generate a test signature based at least in part on the first value of the first parameter;
      compare the test signature to a reference signature;
      pass the at least one device under test in response to the test signature matching the reference signature; and
      fail the at least one device under test in response to the test signature not matching the reference signature,
   wherein the first parameter defines a first physical property of a first physical domain, and each of the test signature and the reference signature includes a second parameter that defines a second physical property of a second physical domain different from the first physical domain.

13. The apparatus according to claim 12, wherein the first physical domain is one of a magnetic domain, an electrical domain, a thermal domain, and a mechanical domain, and the second physical domain is another of the magnetic domain, the electrical domain, the thermal domain, and the mechanical domain.

14. An apparatus for testing electric machines, comprising:
   one or more processors; and
   a memory coupled to the one or more processors and including program code that, when executed by the one or more processors, causes the apparatus to:
      stimulate at least one device under test with at least one stimulus as part of a static test;
      measure a first value of a first parameter indicative of a response of the at least one device under test to the at least one stimulus of the static test;

generate a test signature based at least in part on the first value of the first parameter;
compare the test signature to a reference signature;
pass the at least one device under test in response to the test signature matching the reference signature; and
fail the at least one device under test in response to the test signature not matching the reference signature,
wherein the at least one device under test includes a stator of a test machine, the at least one stimulus includes an electric signal applied to a winding of the stator, and the first parameter includes a temperature of the stator.

15. An apparatus for testing electric machines, comprising:
one or more processors; and
a memory coupled to the one or more processors and including program code that, when executed by the one or more processors, causes the apparatus to:
stimulate at least one device under test with at least one stimulus as part of a static test;
measure a first value of a first parameter indicative of a response of the at least one device under test to the at least one stimulus of the static test;
generate a test signature based at least in part on the first value of the first parameter;
compare the test signature to a reference signature;
pass the at least one device under test in response to the test signature matching the reference signature; and
fail the at least one device under test in response to the test signature not matching the reference signature,
wherein the at least one stimulus includes a mechanical forcing function applied to an input point of the at least one device under test, and the first parameter is a vibration of the at least one device under test.

16. The apparatus according to claim 15, wherein the test signature includes at least a portion of a test vibration map of the at least one device under test, the reference signature includes the at least a portion of a reference vibration map of the reference device, and the vibration of the at least one device under test is determined from the at least the portion of the test vibration map.

17. The apparatus according to claim 16, wherein each vibration map is divided into cells, and the vibration of each cell of the test vibration map is compared to a corresponding cell of the reference vibration map.

18. The apparatus according to claim 15, wherein the mechanical forcing function is one of a plurality of mechanical forcing functions, and the at least one stimulus comprises a stimulation pattern including the plurality of mechanical forcing functions each having an independent amplitude, an independent phase, an independent orientation, and an independent input point.

19. An apparatus for testing electric machines, comprising:
one or more processors; and
a memory coupled to the one or more processors and including program code that, when executed by the one or more processors, causes the apparatus to:
measure a first value of a first parameter indicative of a response of at least one device under test to a static test;
generate a test signature based at least in part on the first value of the first parameter;
compare the test signature to a reference signature;
pass the at least one device under test in response to the test signature matching the reference signature; and
fail the at least one device under test in response to the test signature not matching the reference signature,
wherein said electric machine is a generator for a wind turbine, and wherein said testing of said electric machine is performed prior to installation of said generator in said wind turbine.

20. A method for testing electric machines, comprising:
measuring a first value of a first parameter indicative of a response of at least one device under test to a static test;
generating a test signature based at least in part on the first value of the first parameter;
comparing the test signature to a reference signature;
passing the at least one device under test in response to the test signature matching the reference signature;
failing the at least one device under test in response to the test signature not matching the reference signature;
installing the at least one device under test in the wind turbine in response to the at least one device under test passing; and
not installing the at least one device under test in the wind turbine in response to the at least one device under test failing.

21. The method according to claim 20, wherein the first parameter defines a first physical property of a first physical domain, wherein the first physical domain is one of a magnetic domain, an electrical domain, a thermal domain, and a mechanical domain.

22. A method for testing electric machines, comprising:
measuring a first value of a first parameter indicative of a response of at least one device under test to a static test;
generating a test signature based at least in part on the first value of the first parameter;
comparing the test signature to a reference signature;
passing the at least one device under test in response to the test signature matching the reference signature; and
failing the at least one device under test in response to the test signature not matching the reference signature;
wherein the test signature includes at least a portion of a test map of the at least one device under test, the reference signature includes at least a portion of a reference map of the reference device, and the first parameter of the at least one device under test is determined from the at least the portion of the test map.

23. The method according to claim 22, wherein each test map and each reference map is divided into cells, and the first parameter of each cell of the test map is compared to the first parameter of a corresponding cell of the reference map.

24. A computer program product comprising:
a non-transitory computer-readable storage medium; and
program code stored on the non-transitory computer-readable storage medium that, when executed by one or more processors, causes the one or more processors to:
measure a first value of a first parameter indicative of a response of at least one device under test to a static test;
generate a test signature based at least in part on the first value of the first parameter;
measure a second value of the first parameter indicative of the response of a reference device to the static test,
generate a reference signature based at least in part on the second value of the first parameter;
compare the test signature to a reference signature;
pass the at least one device under test in response to the test signature matching the reference signature; and
fail the at least one device under test in response to the test signature not matching the reference signature.

* * * * *